(12) United States Patent
Lee et al.

(10) Patent No.: US 7,915,718 B2
(45) Date of Patent: Mar. 29, 2011

(54) APPARATUS FOR FLIP-CHIP PACKAGING PROVIDING TESTING CAPABILITY

(75) Inventors: Teck Kheng Lee, Singapore (SG); Wuu Yean Tay, Singapore (SG); Kian Chai Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 568 days.

(21) Appl. No.: 10/150,892

(22) Filed: May 17, 2002

(65) Prior Publication Data

US 2003/0164551 A1    Sep. 4, 2003

(30) Foreign Application Priority Data

Mar. 4, 2002  (SG) .............................. 200201289-6

(51) Int. Cl.
H01L 23/495 (2006.01)
H01L 29/40 (2006.01)

(52) U.S. Cl. ...................... 257/668; 257/778; 361/749
(58) Field of Classification Search .................. 257/666, 257/778, 686, 668, 685, 777; 329/758, 763, 329/765, 754; 438/14; 361/749
See application file for complete search history.

(56) References Cited

U.S. PATENT DOCUMENTS

| | | | |
|---|---|---|---|
| 3,239,496 A | 3/1966 | Jurslch | |
| 4,074,342 A | 2/1978 | Honn et al. | |
| 4,772,936 A | * 9/1988 | Reding et al. ................. | 257/668 |
| 4,807,021 A | 2/1989 | Okumura | |
| 4,818,728 A | 4/1989 | Rai et al. | |
| 4,954,875 A | 9/1990 | Clements | |
| 5,148,265 A | 9/1992 | Khandros | |
| 5,241,456 A | 8/1993 | Marcinkiewicz et al. | |
| 5,258,648 A | * 11/1993 | Lin ............................... | 257/778 |
| 5,346,861 A | 9/1994 | Khandros | |
| 5,347,159 A | 9/1994 | Khandros et al. | |
| 5,366,794 A | 11/1994 | Nakao | |
| 5,374,303 A | 12/1994 | Van Hoorn | |
| 5,385,869 A | 1/1995 | Liu et al. | |
| 5,386,341 A | 1/1995 | Olson et al. | |
| 5,397,921 A | 3/1995 | Karnezos | |
| 5,404,044 A | 4/1995 | Booth et al. | |

(Continued)

FOREIGN PATENT DOCUMENTS

EP    0475022 A1    3/1992

(Continued)

OTHER PUBLICATIONS

Al-Sarawi et al., "A review of 3-D packaging technology," Components, Packaging, and Manufacturing Technology, Part B: IEEE Transactions on Advanced Packaging, vol. 21, Issue 1, Feb. 1998, pp. 2-14.

(Continued)

Primary Examiner — Matthew C Landau
Assistant Examiner — James M Mitchell
(74) Attorney, Agent, or Firm — TraskBritt

(57) ABSTRACT

A method and apparatus for increasing the integrated circuit density in a flip-chip semiconductor device assembly including an interposer substrate facilitating use with various semiconductor die conductive bump arrangements. The interposer substrate includes a plurality of recesses formed in at least one of a first surface and a second surface thereof, wherein the recesses are arranged in a plurality of recess patterns. The interposer substrate also provides enhanced accessibility for test probes for electrical testing of the resulting flip-chip semiconductor device assembly.

32 Claims, 10 Drawing Sheets

U.S. PATENT DOCUMENTS

| | | | |
|---|---|---|---|
| 5,409,865 A | 4/1995 | Karnezos | |
| 5,422,205 A | 6/1995 | Inoue et al. | |
| 5,422,615 A | 6/1995 | Shibagaki et al. | |
| 5,438,477 A | 8/1995 | Pasch | |
| 5,448,511 A | 9/1995 | Paurus et al. | |
| 5,468,681 A | 11/1995 | Pasch | |
| 5,468,995 A | 11/1995 | Higgins, III | |
| 5,489,804 A | 2/1996 | Pasch | |
| 5,504,277 A | 4/1996 | Danner | |
| 5,523,622 A * | 6/1996 | Harada et al. | 257/734 |
| 5,598,033 A | 1/1997 | Behlen et al. | |
| 5,608,265 A | 3/1997 | Kitano et al. | |
| 5,646,446 A | 7/1997 | Nicewarner, Jr. et al. | |
| 5,663,530 A | 9/1997 | Schueller et al. | |
| 5,668,405 A | 9/1997 | Yamashita | |
| 5,674,785 A | 10/1997 | Akram et al. | |
| 5,679,977 A | 10/1997 | Khandros | |
| 5,683,942 A | 11/1997 | Kata | |
| 5,697,148 A | 12/1997 | Lance, Jr. et al. | |
| 5,699,027 A | 12/1997 | Tsuji et al. | |
| 5,702,662 A | 12/1997 | Smith et al. | |
| 5,710,071 A | 1/1998 | Beddingfield et al. | |
| 5,719,449 A | 2/1998 | Strauss | |
| 5,721,151 A | 2/1998 | Padmanabhan et al. | |
| 5,723,347 A * | 3/1998 | Hirano et al. | 29/25.01 |
| 5,739,585 A | 4/1998 | Akram et al. | |
| 5,742,100 A * | 4/1998 | Schroeder et al. | 257/778 |
| 5,747,982 A | 5/1998 | Dromgoole et al. | |
| 5,752,182 A | 5/1998 | Nakatsuka et al. | |
| 5,758,413 A | 6/1998 | Chong et al. | |
| 5,768,109 A | 6/1998 | Gulick et al. | |
| 5,776,797 A | 7/1998 | Nicewarner, Jr. et al. | |
| 5,777,391 A | 7/1998 | Nakamura | |
| 5,796,591 A * | 8/1998 | Dalal et al. | 361/779 |
| 5,798,285 A | 8/1998 | Bentlage et al. | |
| 5,798,567 A | 8/1998 | Kelly et al. | |
| 5,805,422 A | 9/1998 | Otake et al. | |
| 5,812,378 A * | 9/1998 | Fjelstad et al. | 361/769 |
| 5,818,113 A | 10/1998 | Iseki et al. | |
| 5,821,624 A | 10/1998 | Pasch | |
| 5,821,626 A * | 10/1998 | Ouchi et al. | 257/778 |
| 5,834,338 A | 11/1998 | Takeda et al. | |
| 5,834,366 A | 11/1998 | Akram | |
| 5,834,848 A | 11/1998 | Iwasaki | |
| 5,835,355 A | 11/1998 | Dordi | |
| 5,843,808 A | 12/1998 | Karnezos | |
| 5,844,168 A | 12/1998 | Schueller et al. | |
| 5,844,315 A | 12/1998 | Melton et al. | |
| 5,866,953 A | 2/1999 | Akram et al. | |
| 5,886,408 A | 3/1999 | Ohki et al. | |
| 5,891,753 A | 4/1999 | Akram | |
| 5,892,271 A * | 4/1999 | Takeda et al. | 257/668 |
| 5,898,224 A | 4/1999 | Akram | |
| 5,905,303 A | 5/1999 | Kata | |
| 5,920,118 A * | 7/1999 | Kong | 257/684 |
| 5,973,389 A | 10/1999 | Culnane et al. | |
| 5,973,404 A | 10/1999 | Akram et al. | |
| 5,977,640 A | 11/1999 | Bertin et al. | |
| 5,982,030 A | 11/1999 | MacIntrye | |
| 5,984,691 A | 11/1999 | Brodsky et al. | |
| 5,986,460 A * | 11/1999 | Kawakami | 324/765 |
| 5,990,545 A | 11/1999 | Schueller et al. | |
| 5,991,161 A | 11/1999 | Samaras et al. | |
| 6,005,776 A | 12/1999 | Holman et al. | |
| 6,008,532 A * | 12/1999 | Carichner | 257/691 |
| 6,008,543 A | 12/1999 | Iwabuchi | |
| 6,011,694 A | 1/2000 | Hirakawa | |
| 6,013,948 A | 1/2000 | Akram | |
| 6,020,629 A | 2/2000 | Farnworth | |
| 6,022,761 A | 2/2000 | Grupen-Shemansky et al. | |
| 6,024,584 A | 2/2000 | Lemke et al. | |
| 6,027,346 A | 2/2000 | Sinsheimer et al. | |
| 6,028,365 A | 2/2000 | Akram et al. | |
| 6,034,427 A | 3/2000 | Lan et al. | |
| 6,037,665 A | 3/2000 | Miyazaki | |
| 6,039,889 A | 3/2000 | Zhang et al. | |
| 6,040,630 A | 3/2000 | Panchou et al. | |
| 6,048,755 A | 4/2000 | Jiang et al. | |
| 6,050,832 A | 4/2000 | Lee et al. | |
| 6,057,178 A | 5/2000 | Galuschki et al. | |
| 6,060,782 A | 5/2000 | Ohsono et al. | |
| 6,064,114 A | 5/2000 | Higgins, III | |
| 6,072,233 A | 6/2000 | Corisis et al. | |
| 6,074,897 A | 6/2000 | Degani et al. | |
| 6,075,710 A | 6/2000 | Lau | |
| 6,079,991 A | 6/2000 | Lemke et al. | |
| 6,093,035 A | 7/2000 | Lemke et al. | |
| 6,116,921 A | 9/2000 | Scholz et al. | |
| 6,124,631 A | 9/2000 | Cardot et al. | |
| 6,127,736 A | 10/2000 | Akram | |
| 6,133,072 A | 10/2000 | Fjelstad | |
| 6,133,637 A | 10/2000 | Hikita et al. | |
| 6,137,062 A | 10/2000 | Zimmerman | |
| 6,137,164 A | 10/2000 | Yew et al. | |
| 6,137,183 A | 10/2000 | Sako | |
| 6,144,091 A * | 11/2000 | Washida | 257/693 |
| 6,157,541 A | 12/2000 | Hacke | |
| 6,165,885 A | 12/2000 | Gaynes et al. | |
| 6,172,422 B1 | 1/2001 | Chigawa et al. | |
| 6,177,723 B1 | 1/2001 | Eng et al. | |
| 6,179,598 B1 | 1/2001 | Brand | |
| 6,180,881 B1 | 1/2001 | Isaak | |
| 6,191,487 B1 | 2/2001 | Rodenbeck et al. | |
| 6,198,634 B1 * | 3/2001 | Armezzani et al. | 361/760 |
| 6,208,521 B1 * | 3/2001 | Nakatsuka | 361/749 |
| 6,208,525 B1 * | 3/2001 | Imasu et al. | 361/783 |
| 6,212,768 B1 | 4/2001 | Murakami | |
| 6,214,156 B1 | 4/2001 | Takano et al. | |
| 6,217,343 B1 | 4/2001 | Okuno | |
| 6,218,202 B1 | 4/2001 | Yew et al. | |
| 6,219,911 B1 | 4/2001 | Estes et al. | |
| 6,221,763 B1 | 4/2001 | Gilton et al. | |
| 6,222,265 B1 | 4/2001 | Akram et al. | |
| 6,225,688 B1 | 5/2001 | Kim et al. | |
| 6,229,218 B1 * | 5/2001 | Casey et al. | 257/778 |
| 6,229,711 B1 | 5/2001 | Yoneda | |
| 6,232,666 B1 | 5/2001 | Corisis et al. | |
| 6,239,496 B1 | 5/2001 | Asada | |
| 6,242,932 B1 | 6/2001 | Hembree | |
| 6,255,740 B1 * | 7/2001 | Tsuji et al. | 257/792 |
| 6,259,038 B1 * | 7/2001 | Sakaguchi et al. | 174/261 |
| 6,262,895 B1 | 7/2001 | Forthun | |
| 6,265,775 B1 | 7/2001 | Seyyedy | |
| 6,268,654 B1 | 7/2001 | Glenn et al. | |
| 6,271,469 B1 | 8/2001 | Ma et al. | |
| 6,281,046 B1 | 8/2001 | Lam | |
| 6,282,094 B1 | 8/2001 | Lo et al. | |
| 6,285,081 B1 | 9/2001 | Jackson | |
| 6,291,265 B1 | 9/2001 | Mess | |
| 6,291,775 B1 | 9/2001 | Saitoh | |
| 6,291,884 B1 | 9/2001 | Glenn et al. | |
| 6,294,455 B1 | 9/2001 | Ahn | |
| 6,295,730 B1 | 10/2001 | Akram | |
| 6,300,679 B1 | 10/2001 | Mukerji et al. | |
| 6,310,288 B1 | 10/2001 | Moden | |
| 6,313,522 B1 | 11/2001 | Akram et al. | |
| 6,323,060 B1 | 11/2001 | Isaak | |
| 6,323,434 B1 * | 11/2001 | Kurita et al. | 174/255 |
| 6,338,985 B1 * | 1/2002 | Greenwood | 438/126 |
| 6,351,029 B1 | 2/2002 | Isaak | 257/688 |
| 6,376,769 B1 * | 4/2002 | Chung | 174/524 |
| 6,404,648 B1 | 6/2002 | Slupe et al. | |
| 6,407,450 B1 * | 6/2002 | Verma et al. | 257/697 |
| 6,413,102 B2 | 7/2002 | Jiang et al. | |
| 6,429,516 B1 | 8/2002 | Tsunoi | |
| 6,432,737 B1 | 8/2002 | Webster | |
| 6,433,413 B1 * | 8/2002 | Farrar | 257/678 |
| 6,452,807 B1 * | 9/2002 | Barrett | 361/767 |
| 6,468,831 B2 | 10/2002 | Leong et al. | |
| 6,482,676 B2 | 11/2002 | Tsunoi et al. | |
| 6,486,544 B1 | 11/2002 | Hashimoto | |
| 6,489,676 B2 | 12/2002 | Taniguchi et al. | |
| 6,489,687 B1 * | 12/2002 | Hashimoto | 257/777 |
| 6,492,714 B1 * | 12/2002 | Kasatani | 257/678 |
| 6,492,737 B1 | 12/2002 | Imasu et al. | |
| 6,504,241 B1 * | 1/2003 | Yanagida | 257/686 |
| 6,507,098 B1 | 1/2003 | Lo et al. | |

| | | | |
|---|---|---|---|
| 6,507,118 B1 * | 1/2003 | Schueller | 257/778 |
| 6,515,324 B2 | 2/2003 | Shibuya et al. | |
| 6,518,677 B1 | 2/2003 | Capote et al. | |
| 6,522,017 B2 * | 2/2003 | Horiuchi et al. | 257/778 |
| 6,534,853 B2 * | 3/2003 | Liu et al. | 257/692 |
| 6,552,910 B1 | 4/2003 | Moon et al. | |
| 6,556,454 B1 * | 4/2003 | D'Amato et al. | 361/777 |
| 6,558,978 B1 * | 5/2003 | McCormick | 438/108 |
| 6,563,223 B2 * | 5/2003 | Freeman | 257/778 |
| 6,576,992 B1 * | 6/2003 | Cady et al. | 257/686 |
| 6,586,830 B2 | 7/2003 | Saito | |
| 6,600,222 B1 | 7/2003 | Levardo | |
| 6,610,559 B2 | 8/2003 | Wang et al. | |
| 6,617,671 B1 * | 9/2003 | Akram | 257/668 |
| 6,624,060 B2 | 9/2003 | Chen et al. | |
| 6,634,100 B2 | 10/2003 | Akram et al. | |
| 6,650,007 B2 | 11/2003 | Moden et al. | |
| 6,700,208 B1 * | 3/2004 | Yoneda | 257/779 |
| 6,714,418 B2 | 3/2004 | Frankowsky et al. | |
| 6,730,855 B2 | 5/2004 | Bando | |
| 6,744,122 B1 | 6/2004 | Hashimoto | |
| 6,780,746 B2 | 8/2004 | Kinsman et al. | |
| 6,787,918 B1 * | 9/2004 | Tsai et al. | 257/778 |
| 6,791,195 B2 | 9/2004 | Urushima | |
| 6,800,930 B2 | 10/2004 | Jackson et al. | |
| 6,841,862 B2 | 1/2005 | Kikuchi et al. | |
| 6,858,926 B2 | 2/2005 | Moden et al. | |
| 6,867,496 B1 | 3/2005 | Hashimoto | |
| 6,884,653 B2 | 4/2005 | Larson | |
| RE39,628 E * | 5/2007 | Isaak | 257/686 |
| 7,347,702 B2 | 3/2008 | Eldridge | |
| 7,619,313 B2 * | 11/2009 | Corisis et al. | 257/777 |
| 2001/0048157 A1 | 12/2001 | Murtuza | |
| 2001/0053563 A1 | 12/2001 | Kim et al. | |
| 2002/0027080 A1 | 3/2002 | Yoshioka et al. | |
| 2002/0041033 A1 * | 4/2002 | Murayama et al. | 257/774 |
| 2002/0045611 A1 | 4/2002 | Abrams et al. | |
| 2002/0047215 A1 * | 4/2002 | Akiyama et al. | 257/778 |
| 2002/0050641 A1 * | 5/2002 | Freeman | 257/737 |
| 2002/0079594 A1 | 6/2002 | Sakurai | |
| 2002/0089050 A1 * | 7/2002 | Michii et al. | 257/686 |
| 2002/0127769 A1 | 9/2002 | Ma et al. | |
| 2002/0142513 A1 | 10/2002 | Fee et al. | |
| 2002/0167092 A1 | 11/2002 | Fee et al. | |
| 2002/0185661 A1 | 12/2002 | Kawanobe et al. | |
| 2003/0012930 A1 | 1/2003 | Grousseau | |
| 2003/0042595 A1 * | 3/2003 | Canella | 257/690 |
| 2003/0134450 A1 * | 7/2003 | Lee | 438/106 |
| 2003/0164543 A1 | 9/2003 | Lee | |
| 2003/0178719 A1 | 9/2003 | Combs et al. | |
| 2003/0209813 A1 | 11/2003 | Azuma | |
| 2004/0026773 A1 * | 2/2004 | Koon et al. | 257/692 |
| 2004/0130020 A1 | 7/2004 | Kuwabara et al. | |
| 2004/0197955 A1 | 10/2004 | Lee | |
| 2004/0212055 A1 | 10/2004 | Exposito et al. | |
| 2004/0217454 A1 | 11/2004 | Brechignac et al. | |
| 2005/0073039 A1 | 4/2005 | Kasuya et al. | |
| 2005/0122265 A1 | 6/2005 | Gaucher et al. | |
| 2006/0065972 A1 | 3/2006 | Khan et al. | |
| 2006/0091523 A1 | 5/2006 | Shimanuki | |
| 2006/0289989 A1 | 12/2006 | Yee et al. | |
| 2008/0178463 A1 | 7/2008 | Okubora | |
| 2009/0115050 A1 | 5/2009 | Kasuya et al. | |

FOREIGN PATENT DOCUMENTS

| | | |
|---|---|---|
| EP | 0684644 | 11/1995 |
| EP | 0411165 B1 | 4/1997 |
| EP | 0997942 A2 | 5/2000 |
| EP | 1009027 | 6/2000 |
| JP | 04030456 * | 2/1992 |
| JP | 09082857 A | 3/1997 |
| JP | 10270484 * | 10/1998 |
| JP | 2002-028702/04 | 9/1999 |
| JP | 2000-183082 | 6/2000 |
| JP | 02000230964 * | 8/2000 |
| JP | 2001077294 | 3/2001 |
| KR | 2001054744 | 7/2001 |
| KR | 20010058357 | 7/2001 |
| WO | WO 99/65282 | 12/1999 |
| WO | WO 01/33623 | 5/2001 |

OTHER PUBLICATIONS

Andros et al., "TBGA Package Technology," Components, Packaging, and Manufacturing Technology, Part B: IEEE Transactions on Advanced Packaging, vol. 17, Issue 4, Nov. 1994, pp. 564-568.

Clot et al., "Flip-Chip on Flex for 3D Packaging," 1999. 24th IEEE/CPMT, Oct. 18-19, 1999, pp. 36-41.

Ferrando et al., "Industrial approach of a flip-chip method using the stud-bumps with a non-conductive paste," Adhesive Joining and Coating Technology in Electronics Manufacturing, 2000. Proceedings. 4th International Conference on, Jun. 18-21, 2000, pp. 205-211.

Gallagher et al., "A Fully Additive, Polymeric Process for the Fabrication and Assembly of Substrate and Component Level Packaging," The First IEEE International Symposium on Polymeric Electronics Packaging, Oct. 26-30, 1997, pp. 56-63.

Geissinger et al., "Tape Based CSP Package Supports Fine Pitch Wirebonding," Electronics Manufacturing Technology Symposium, 2002, IEMT 2002, 27th Annual IEEE/SEMI International, Jul. 17-18, 2002, pp. 41-452.

Hatanaka, H., "Packaging processes using flip chip bonder and future directions of technology development," Electronics Packaging Technology Conference, 2002. 4th, Dec. 10-12, 2002, pp. 434-439.

Haug et al., "Low-Cost Direct Chip Attach: Comparison of SMD Compatible FC Soldering with Anisotropically Conductive Adhesive FC Bonding," IEEE Transactions on Electronics Packaging Manufacturing, vol. 23, No. 1, Jan. 2000, pp. 12-18.

Kloeser et al., "Fine Pitch Stencil Printing of Sn/Pb and Lead Free Solders for Flip Chip Technology," IEEE Transactions of CPMT—Part C, vol. 21, No. 1, 1998, pp. 41-49.

Lee et al., "Enhancement of Moisture Sensitivity Performance of a FBGA," Proceedings of International Symposium on Electronic Materials & Packaging, 2000, pp. 470-475.

Li et al., "Stencil Printing Process Development for Flip Chip Interconnect," IEEE Transactions Part C: Electronics Packaging Manufacturing, vol. 23, Issue 3, (Jul. 2000), pp. 165-170.

Lyons et al., "A New Approach to Using Anisotropically Conductive Adhesives for Flip-Chip Assembly, Part A," *IEEE Transactions on Components, Packaging, and Manufacturing Technology*, vol. 19, Issue 1, Mar. 1996, pp. 5-11.

Teo et al., "Enhancing Moisture Resistance of PBGA," *Electronic Components and Technology Conference*, 1988. 48th IEEE, May 25-28, 1998, pp. 930-935.

Teutsch et al, "Wafer Level CSP using Low Cost Electroless Redistribution Layer," *Electronic Components and Technology Conference*, 2000. 2000 Proceedings. 50th, May 21-24, 2000, pp. 107-113.

"The 2003 International Technology Roadmap for Semiconductor: Assembly and Packaging.".

Tsui et al., "Pad redistribution technology for flip chip applications," *Electronic Components and Technology Conference*, 1998. 48th IEEE, May 25-28, 1998, pp. 1098-1102.

Xiao et al., "Reliability study and failure analysis of fine pitch solder-bumped flip chip on low-cost flexible substrate without using stiffener," IEEE, 2002. Proceedings 52nd, May 28-31, 2002, pp. 112-118.

Isaak, H. et al., "Development of Flex Stackable Carriers" IEEE Electronic Components and Technology Conference, 2000 Proceedings 50th, May 21, 2000-May 24, 2000, Las Vegas, NV, USA, pp. 378-384, IEEE Catalog No. 00CH37070.

Australian Patent Office, Search Report, May 30, 2003, 4 pages.

Australian Search Report dated Dec. 10, 2004 (4 pages).

Australian Search Report dated Aug. 11, 2004 (3 pages).

Australian Search Report dated Aug. 16, 2004 (4 pages).

Australian Search Report dated Nov. 8, 2005 (5 pages).

Xiao et al., "Reliability Study and Failure Analysis of Fine Pitch Solder-Bumped Flip Chip on Low-Cost Flexible Substrate without Using Stiffener," IEEE, 2002. Proceedings 52nd, May 28-31, 2002, pp. 112-118.

Xiao et al., "Reliability Study and Failure Analysis of Fine Pitch Solder Bumped Flip Chip on Low-Cost Printed Circuit Board Substrate," IEEE, 2001, Electronic Components and Technology Conference, 8 pages.

Australian Search Report dated Dec. 8, 2004 (5 pages).

Australian Search Report dated Apr. 10, 2008, for Application No. 200506127-0 (3 pages).

* cited by examiner

APPARATUS FOR FLIP-CHIP PACKAGING PROVIDING TESTING CAPABILITY

CROSS-REFERENCE TO RELATED APPLICATIONS

This application is related to U.S. patent application Ser. No. 09/944,465 filed Aug. 30, 2001, now U.S. Pat. No. 6,756,251, issued Jun. 29, 2004, and entitled MICROELECTRONIC DEVICES AND METHODS OF MANUFACTURE, and to the following U.S. patent applications filed on even date herewith: Ser. No. 10/150,893, now U.S. Pat. No. 7,145,225, issued Dec. 5, 2006, entitled INTERPOSER CONFIGURED TO REDUCE THE PROFILES OF SEMICONDUCTOR DEVICE ASSEMBLIES AND PACKAGES INCLUDING THE SAME AND METHODS; Ser. No. 10/150,516, now U.S. Pat. No. 7,112,520, issued Sep. 26, 2006, entitled SEMICONDUCTOR DIE PACKAGES WITH RECESSED INTERCONNECTING STRUCTURES AND METHODS FOR ASSEMBLING THE SAME; Ser. No. 10/150,653, now U.S. Pat. No. 7,161,237, issued Jan. 9, 2007, entitled FLIP CHIP PACKAGING USING RECESSED INTERPOSER TERMINALS; Ser. No. 10/150,902, now U.S. Pat. No. 6,975,035, issued Dec. 13, 2005, entitled METHOD AND APPARATUS FOR DIELECTRIC FILLING OF FLIP CHIP ON INTERPOSER ASSEMBLY; and Ser. No. 10/150,901, now U.S. Pat. No. 7,348,215, issued Mar. 25, 2008, entitled METHODS FOR ASSEMBLY AND PACKAGING OF FLIP CHIP CONFIGURED DICE WITH INTERPOSER. This application is also related to U.S. patent application Ser. No. 10/710,229, filed Jun. 28, 2004, now U.S. Pat. No. 7,087,994, issued Aug. 8, 2006; U.S. patent application Ser. No. 11/501,600, filed Aug. 8, 2006, now abandoned; U.S. patent application Ser. No. 11/398,912, filed Apr. 6, 2006, pending; U.S. patent application Ser. No. 10/933,060, filed Sep. 1, 2004, now U.S. Pat. No. 7,230,330, issued Jun. 12, 2007; U.S. patent application Ser. No. 11/760,458, filed Jun. 8, 2007; now U.S. Pat. No. 7,569,473, issued Aug. 4, 2009; U.S. patent application Ser. No. 11/505,759, filed Aug. 16, 2006, now U.S. Pat. No. 7,531,906, issued May 12, 2009; U.S. patent application Ser. No. 10/782,270, filed Feb. 18, 2004, now U.S. Pat. No. 7,122,907, issued Oct. 17, 2006; U.S. patent application Ser. No. 10/829,647, filed Apr. 22, 2004, now U.S. Pat. No. 7,534,660, issued May 19, 2009 and U.S. patent application Ser. No. 10/829,603, filed Apr. 22, 2004, now U.S. Pat. No. 7,087,460, issued Aug. 8, 2006.

BACKGROUND OF THE INVENTION

1. Field of the Invention

The present invention relates generally to packaging of semiconductor dice and, more specifically, to packaging of flip-chip configured semiconductor dice employing an interposer substrate having recesses in one or both sides thereof for receiving discrete conductive elements projecting from the semiconductor dice.

2. State of the Art

Chip-On-Board ("COB") or Board-On-Chip ("BOC") technology is used to attach a semiconductor die directly to a carrier substrate such as a printed circuit board ("PCB"), or an interposer may be employed and attachment may be effected using flip-chip attachment, wire bonding, or tape automated bonding ("TAB").

Flip-chip attachment generally includes electrically and mechanically attaching a semiconductor die by its active surface to an interposer or other carrier substrate using a pattern of discrete conductive elements therebetween. The discrete conductive elements are generally disposed on the active surface of the die during fabrication thereof, but may instead be disposed on the carrier substrate. The discrete conductive elements may comprise minute conductive bumps, balls or columns of various configurations. Each discrete conductive element is placed corresponding to mutually aligned locations of bond pads (or other I/O locations) on the semiconductor die and terminals on the carrier substrate when the two components are superimposed. The semiconductor die is thus electrically and mechanically connected to the carrier substrate by, for example, reflowing conductive bumps of solder or curing conductive or conductor-filled epoxy bumps. A dielectric underfill may then be disposed between the die and the carrier substrate for environmental protection and to enhance the mechanical attachment of the die to the carrier substrate.

Wire bonding and TAB attachment techniques generally begin with attaching a semiconductor die by its back side to the surface of a carrier substrate with an appropriate adhesive, such as an epoxy or silver solder. In wire bonding, a plurality of fine wires is discretely attached to bond pads on the semiconductor die and then extended and bonded to corresponding terminal pads on the carrier substrate. A dielectric encapsulant such as a silicone or epoxy may then be applied to protect the fine wires and bond sites. In TAB, ends of metal traces carried on a flexible insulating tape such as a polyimide are attached, as by thermocompression bonding, directly to the bond pads on the semiconductor die and corresponding terminal pads on the carrier substrate.

Higher performance, lower cost, increased miniaturization of components, and greater packaging density of integrated circuits are ongoing goals of the computer industry. As new generations of integrated circuit products are released, the number of components used to fabricate them tends to decrease due to advances in technology even though the functionality of the products increase. For example, on the average, there is approximately a ten percent decrease in components for every product generation over the previous generation having equivalent functionality.

Recent trends in packaging are moving with increasing rapidity toward flip-chip attachment due to improved electrical performance and greater packaging density. However, flip-chip attachment is not without problems, such as the high cost for a third metal reroute of bond pads from the middle or periphery of a die to a two-dimensional array which, in turn, may result in overlong and unequal length electrical paths. In addition, many conventional flip-chip techniques exhibit a lack of consistent reliability of the interconnections between the chip and the interposer or other carrier substrate as a result of the increased miniaturization as well as difficulties in mutual alignment of the die and carrier substrate to effect such interconnections. Effective rerouting of bond pads may also be limited by die size. Another hindrance to flip-chip packaging has been difficulty in electrically testing completed flip-chip semiconductor device assemblies using existing test probe equipment. Thus, even if a semiconductor die in the assembly is a so-called "known good die," the assembly itself may exhibit defects that are not easily detected and that may, even if detected, be at a stage in the fabrication process subsequent to encapsulation, rendering rework of the assembly difficult if not impossible.

Further, flip-chip packages for a bumped semiconductor die employing an interposer may be undesirably thick due to the combined height of the die and interposer. This is due to the use in conventional packaging techniques of relatively costly interposers comprising dual conductive layers having a dielectric member sandwiched therebetween, the bumped semiconductor die resting on and connected to traces of the conductive layer on one side of the interposer and electrically connected to traces of the conductive layer on the opposing side, conductive vias extending therebetween. Finally, underfilling a flip-chip-attached semiconductor die to a carrier substrate with dielectric filler material can be a lengthy and often unreliable process, and the presence of the underfill makes reworking of defective assemblies difficult if not impossible.

Other difficulties with conventional packages include an inability to accommodate die size reductions, or "shrinks," as a given design progresses through several generations without developing new interposer designs and tooling. As more functionality is included in dice, necessitating a greater number of inputs and outputs (I/Os), decreased spacing or pitch between the I/Os places severe limitations on the use of conventional interposers. In addition, with conventional packages, a die is not tested until package assembly is complete, resulting in excess cost since a defective die or die and interposer assembly is not detected until the package is finished.

For example, U.S. Pat. No. 5,710,071 to Beddingfield et al. discloses a fairly typical flip-chip attachment of a semiconductor die to a substrate and a method of underfilling a gap between the semiconductor die and substrate. In particular, the semiconductor die is attached face down to the substrate, wherein conductive bumps on the die are directly bonded to bond pads on the upper surface of the substrate, which provides the gap between the die and substrate. The underfill material flows through the gap between the semiconductor die and the substrate via capillary action toward an aperture in the substrate, thereby expelling air in the gap through the aperture in the substrate in an effort to minimize voids in the underfill material. However, such an underfilling method still is unnecessarily time consuming due to having to underfill the entire semiconductor die. Further, the flip-chip attachment technique disclosed in U.S. Pat. No. 5,710,071 exhibits difficulties in aligning the conductive bumps with the bond pads on the substrate and requires the expense of having a third metal reroute in the substrate.

Therefore, it would be advantageous to improve the reliability of interconnections between a chip and a carrier substrate such as an interposer by achieving accurate alignment of the interconnections, an improved underfill process, and the elimination of the necessity for a third metal reroute, while reducing total assembly height in combination with the ability to employ commercially available, widely practiced semiconductor device fabrication techniques and materials as well as existing test equipment.

BRIEF SUMMARY OF THE INVENTION

The present invention relates to methods and apparatus for assembling, testing and packaging individual and multiple semiconductor dice with an interposer substrate in a flip-chip-type arrangement and, further, the present invention relates to an interposer substrate having multiple recess patterns for mounting semiconductor dice with differently spaced and sized conductive bump configurations. The present invention provides a flip-chip semiconductor device assembly substantially reduced in height or thickness and with improved mechanical and electrical reliability of the interconnections between a semiconductor die and a carrier substrate in comparison to conventional flip-chip assemblies, while also improving the alignment capability of attaching the semiconductor die to the interposer substrate. The present invention also eliminates the requirement of a third metal reroute necessitated in most flip-chip assemblies and eliminates the need for underfilling or reduces the time for underfilling if optionally effected. In addition, the present invention facilitates relatively simple and efficient testing of the semiconductor assembly.

The flip-chip semiconductor device assembly of the present invention includes an interposer substrate having a first surface and a second surface, wherein at least one of the first surface and the second surface includes multiple recesses formed therein and arranged in at least two different recess patterns for attaching one or more conductively bumped semiconductor dice thereto. The one or more conductively bumped semiconductor dice may be assembled face (or active surface) down to the interposer substrate in a flip-chip-type arrangement so that the conductive bumps of the semiconductor die or dice are disposed in a corresponding recess pattern. Conductive elements in the recesses are interconnected by traces to test pads that are exposed proximate a periphery on at least one of the first and second surfaces of the interposer substrate. Such test pads allow easy access for probe testing the electrical integrity of the one or more semiconductor dice mounted to the interposer substrate.

In this manner, the recesses of the at least two different recess patterns are spaced, sized and configured to substantially receive the conductive bumps on the conductively bumped semiconductor die or dice to an extent so that an active surface of each semiconductor die lies immediately adjacent a surface of the interposer substrate. An adhesive element in the form of a liquid or gel adhesive or an adhesive-coated tape may optionally be disposed between the semiconductor die and adjacent interposer substrate surface. As such, there is a reduction in the height of the flip-chip assembly due to the conductive bumps being substantially or even completely received in the recesses, which allows for the conductive bumps on the die to be formed larger for increased reliability without increasing the height of the flip-chip assembly while also removing the need for a third metal reroute on the semiconductor die. Furthermore, such a flip-chip semiconductor device assembly may eliminate the need for underfilling between a semiconductor die and the interposer substrate. If underfilling is employed, the present invention reduces the time for underfilling the assembly and amount of dielectric filler required, since any space in a recess proximate a conductive bump is minimal and vertical space, or standoff, between the semiconductor die and adjacent interposer substrate surface is at least reduced and, in some instances, greatly reduced due to the presence of the adhesive element.

In a first embodiment, the interposer substrate includes multiple recesses formed in a first recess pattern on the first surface thereof and a second recess pattern on the second surface thereof. The first and second recess patterns are configured such that semiconductor dice having differently spaced and arranged conductive bump configurations thereon (including differently sized semiconductor dice) may each be mounted to the interposer substrate. In this manner, the interposer substrate of the first embodiment may facilitate mounting two semiconductor dice thereto by mounting a first die on the first surface of the interposer substrate and mounting a second die on the second surface of the interposer substrate.

In a second embodiment, the interposer substrate includes multiple recesses formed in a first recess pattern and a second, different recess pattern in the first surface thereof. Such first and second recess patterns enable semiconductor dice having differently spaced and arranged conductive bump configurations thereon (including differently sized dice) to be alternatively mounted to a first surface of the interposer substrate. In this manner, the interposer substrate of the second embodiment facilitates the option of mounting differently sized dice and/or semiconductor dice having differently spaced conductive bump configurations.

In a third embodiment, the interposer substrate includes multiple recesses formed in a first recess pattern and a second, different recess pattern on the first surface of the interposer substrate and a third recess pattern and a fourth, different recess pattern on the second surface of the interposer substrate. The first and second recess patterns are configured so that semiconductor dice having differently spaced and arranged conductive bump configurations thereon (including differently sized semiconductor dice) may be optionally mounted to a first surface of the interposer substrate and the third and fourth recess patterns are configured so that semiconductor dice having differently spaced and arranged conductive bump configurations thereon (including differently sized semiconductor dice) may be optionally mounted to a second surface of the interposer substrate. In this manner, the interposer substrate of the third embodiment facilitates the option of mounting differently sized dice and/or semiconductor dice having differently spaced conductive bump configurations on both the first surface and the second surface of the interposer substrate.

In a fourth embodiment, the interposer substrate includes multiple recesses formed in first, second, third and fourth different recess patterns in the first surface of the interposer substrate. Such recess patterns each are configured and sized so that semiconductor dice having differently spaced conductive bump configurations thereon (including differently sized semiconductor dice) may be optionally mounted to a first surface of the interposer substrate. Thus, the interposer substrate of the fourth embodiment facilitates the option of mounting differently sized dice and/or semiconductor dice having differently spaced conductive bump configurations on the first surface of the interposer substrate.

The recess patterns referred to in the interposer substrate of the previous embodiments may be staggered and/or aligned with respect to each other. Also, the recess patterns may include some recess patterns that are staggered with respect to each other and some recess patterns that are aligned with respect to each other.

Turning to another aspect of the present invention, the conductive bumps utilized for interconnecting the semiconductor die and the interposer substrate may be bonded to conductive elements in the recesses by reflowing the conductive bumps, curing the conductive bumps, ultrasonic bonding, or thermal compression, depending upon the bump material employed. In addition, nonsolid conductive material such as a conductive paste may be provided on the conductive bumps or within the recesses prior to disposing the conductive bumps in the recesses. Alternatively, unattached conductive bumps may be provided in the conductive paste in the recesses, after which, the die may be aligned and attached to the conductive bumps. As such, in addition to providing a more reliable electrical connection between the conductive bumps and the conductive interconnect, the conductive paste compensates for any noncoplanarity due to various conductive bump sizes, recess depths and planarity variation in the surfaces of the semiconductor die and interposer substrate. The adhesive element, as previously mentioned, on the first surface and/or the second surface of the interposer substrate may also compensate and act as a height controller for any irregularities in the coplanarity between a semiconductor die and the interposer substrate.

The flip-chip semiconductor device assembly of the present invention may also include relatively large solder balls or other conductive elements attached to a surface of the interposer substrate, interconnecting with the conductive elements and the conductive bumps of the semiconductor die. The solder balls act as interconnects to another substrate, such as a printed circuit board. The flip-chip semiconductor device assembly may also be fully or partially encapsulated by an encapsulation material or the semiconductor die or dice may be left exposed.

The flip-chip semiconductor device assembly of the present invention may also be assembled at a wafer level, wherein a wafer scale interposer substrate includes at least two different recess patterns. As such, the wafer scale interposer substrate may facilitate assembly with different wafers having different conductive bump configurations, which correspond with the at least two different recess patterns in the wafer scale interposer substrate. In this manner, optional wafers with different conductive bump configurations may be attached face down to the interposer substrate with conductive bumps on the wafer disposed and submerged in recesses formed in the wafer scale interposer substrate. The wafer and wafer scale interposer substrate may then be singulated or diced into individual flip-chip semiconductor device assemblies. Partial encapsulation of these assemblies may be performed at the wafer level and optionally completed subsequent to being diced into individual flip-chip semiconductor device assemblies.

The interposer substrate may be fabricated from a flexible, tape-like material including at least one flexible dielectric member and at least one conductive member laminated thereto. The at least one flexible dielectric member may include a polyimide layer. The at least one conductive member is patterned into traces by etching or printing conductive ink and may include conductive elements at recess locations in the form of conductive pads linked by the conductive traces to test pads and other conductive pads for external connection of the assembly to other like assemblies or to higher-level packaging. The multiple recesses are formed in at least one of the first and second surfaces of the at least one flexible dielectric member by etching, mechanical drilling or punching or laser ablation, wherein each of the recesses extends at least to a portion of a conductive element and is sized and configured to receive the conductive bumps on the semiconductor die. The interposer substrate of the present invention may also be formed of other interposer substrate materials, including non-flexible materials, such as a BT resin, FR4, FR5 and ceramics.

The interposer substrate may comprise a single flexible dielectric member having conductive layers comprising conductive traces on opposing sides thereof or may comprise a single conductive layer laminated between two dielectric members. In either instance, recesses may extend from either side of the interposer substrate through a dielectric member to expose portions of conductive elements.

In another aspect of the present invention, the flip-chip semiconductor device assembly is mounted to a circuit board in a computer or a computer system. In the computer system, the circuit board is electrically connected to a processor device that electrically communicates with an input device and an output device.

Other features and advantages of the present invention will become apparent to those of skill in the art through a consideration of the ensuing description, the accompanying drawings and the appended claims.

BRIEF DESCRIPTION OF THE SEVERAL
VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

DETAILED DESCRIPTION OF THE INVENTION

Figure 1:
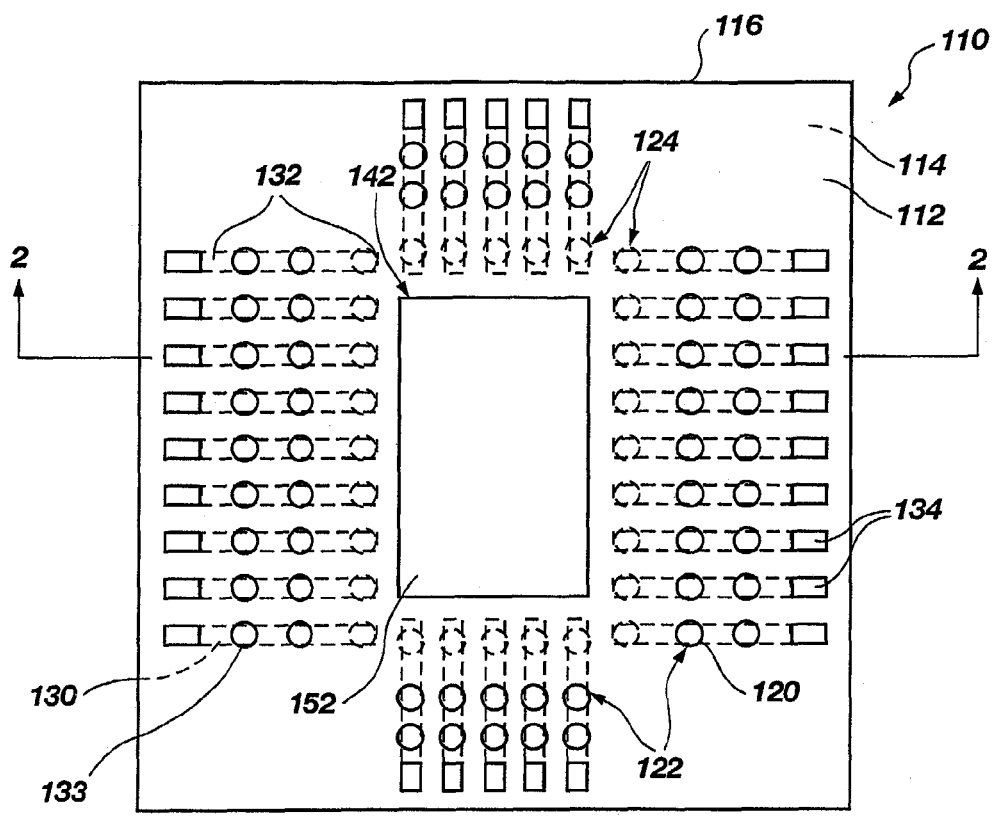
FIG. 1 is a simplified top view of a first embodiment of an interposer substrate illustrating a first recess pattern and a second, different recess pattern (shown in broken lines) formed in the interposer substrate according to the present invention.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same numerical designation.

Figure 2:
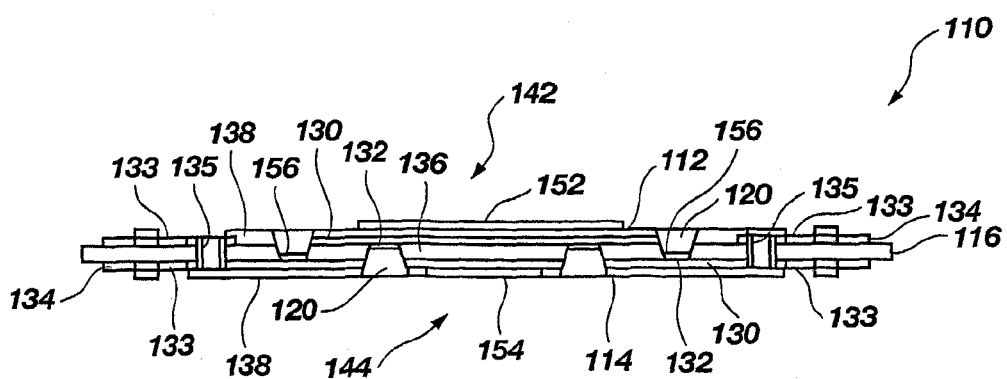
FIG. 2 is a simplified cross-sectional side view taken along line 2-2 in FIG. 1, illustrating multiple recesses in a first surface and a second surface of the interposer substrate according to the present invention.

FIGS. 1 and 2 depict a first embodiment of an interposer substrate 110 of the present invention, wherein FIG. 1 illustrates a simplified top plan view of interposer substrate 110 and FIG. 2 illustrates a simplified cross-sectional view of interposer substrate 110 taken along line 2-2 in FIG. 1. Interposer substrate 110 includes a first surface 112 and a second surface 114, wherein each surface may include multiple recesses 120 formed therein and respective first and second die attach sites 142 and 144, respective first and second adhesive elements 152 and 154 provided on the respective first and second die attach sites 142 and 144, and test pads 134 exposed proximate a periphery 116 of the interposer substrate 110.

Interposer substrate 110 is preferably, but not limited to, a flexible substrate, wherein interposer substrate 110 may include a dielectric member 136 disposed between conductive layers, each comprising a plurality of conductive elements configured as traces 130. The dielectric member 136 may be formed from any known substrate material and is preferably formed of, by way of example, a flexible laminated polymer or polyimide layer, such as UPILEX®, produced by Ube Industries, Ltd., or any other polymer-type layer. The interposer substrate 110 may also be made of a bismaleimide triazine (BT) resin, FR 4, FR 5 or any type of substantially flexible material or nonflexible material, such as a ceramic or epoxy resin.

The conductive layers are preferably formed of copper, or a copper alloy, but may be any suitable electrically conductive material. The conductive layers may include traces 130 extending to conductive pads 132 for connection to conductive bumps of a semiconductor die and conductive pads 133 for use in externally connecting the interposer substrate 110 and test pads 134 for electrical testing of the interposer substrate 110 with one or more semiconductor dice connected thereto. Such traces 130 may be formed subtractively as by masking and etching a conductive layer, additively by printing with conductive ink, or by utilizing any suitable method known in the art. Once the traces 130 are patterned, a protective solder mask 138 may be formed and patterned over the traces 130, leaving conductive pads 133 exposed for formation of conductive bumps such as solder balls thereon. As implied above, the conductive traces, which may, for example, comprise copper or a copper alloy, may be adhered to the dielectric substrate member of UPILEX®, BT resin, FR 4 or, FR 5 laminate material, or other substrate materials, using adhesives as known in the art.

According to the first embodiment of the present invention, the first surface 112 and the second surface 114 of interposer substrate 110 each include multiple recesses 120 or vias formed therein in a preselected pattern and a predetermined sizing. Such recesses 120 may be formed by patterning, utilizing a chemical wet etch or dry etch, mechanical drilling or punching, laser ablation, or any method known in the art and suitable with the type of materials employed for the interposer substrate 110. Optionally, the recesses 120 are preferably formed to expose at least portions of conductive pads 132 of the traces 130, which may, in some instances, comprise the trace ends. It is also contemplated that electroless plating may, optionally, be formed on walls of the recesses 120.

In this manner, each of the multiple recesses 120 extends to a conductive layer, or more specifically, to the traces 130 or conductive pads 132 defining the conductive layer. The conductive traces 130, conductive pads 132 and conductive pads 133 of a conductive layer on the first surface 112 may be interconnected through dielectric member 136 of interposer substrate 110 to other conductive traces 130, conductive pads 132 or conductive pads 133 on the second surface 114 of interposer substrate 110 by conductively plated vias 135, as known in the art. Such conductive pads 133 may be located substantially directly below conductive pads 132 or, optionally, the conductive pads 133 may be at various predetermined locations remote from conductive pads 132 and connected thereto by the conductive traces 130. The conductive traces 130 also extend to test pads 134 proximate the periphery 116 of the interposer substrate 110, test pads 134 being located on one or both surfaces 112 and 114 of interposer substrate 110, as desired. It will be understood that elements of the conductive layer on one side of dielectric member 136 will be offset from those on the other side thereof in the areas wherein recesses 120 are formed through dielectric member 136.

Each plurality of recesses 120 in the first surface 112 and the second surface 114 of interposer substrate 110 is formed in a preselected pattern to correspond with a particular bond pad configuration formed on an active surface of a semiconductor die for attaching thereto. In particular, the recesses 120 in FIG. 1 are configured in two groups, defining a first recess pattern 122 and a second, different recess pattern 124 (broken lines), each to correspond with a peripheral semiconductor die bond pad configuration, wherein the first recess pattern 122 may be on the first surface 112 of interposer substrate 110 and the second recess pattern 124 may be on the second surface 114 of interposer substrate 110. The first recess pattern 122 is depicted to encompass a larger periphery than the second recess pattern 124. That is, the recesses 120 of the first recess pattern 122 are closer to a periphery 116 of interposer substrate 110 than the recesses 120 of the second recess pattern 124. Other preselected recess patterns known in the art and having equal utility in the practice of the present invention may, by way of example, include an I-shaped pattern, a single or double central row recess pattern, or any other recess pattern configured to correspond and match with any particular semiconductor die bond pad configuration. In addition, the multiple recesses 120 themselves may be formed in any suitable shape, such as square, rectangular or circular, and may include tapered sidewalls so that the openings or mouths of the recesses 120 are larger than the bottoms thereof. Optionally, through the use of conductive vias 135 connecting conductive traces 130 on one surface of interposer substrate 110 with conductive traces on an opposing surface of interposer substrate 110, a recess of the first recess pattern 122 may be electrically connected to a recess of second recess pattern 124 and to a common test pad 134.

FIG. 2 depicts a first adhesive element 152 and a second adhesive element 154 disposed on the first surface 112 and the second surface 114, respectively, of the interposer substrate 110. The first adhesive element 152 and the second adhesive element 154 may be disposed on a center portion of interposer substrate 110 at respective first and second die attach sites 142 and 144 of the respective first and second surfaces 112 and 114 of the interposer substrate 110 at a location or locations on such surfaces unoccupied by the recesses 120. The first and second adhesive elements 152 and 154 may comprise any suitable adhesive material as known in the art, such as epoxy, acrylic, or a polyimide adhesive. Both the first and second adhesive elements 152 and 154 may also comprise, without limitation, a dielectric tape such as a polyimide tape bearing adhesive on both sides thereof with the tape surface facing away from interposer substrate 110 being covered with a release layer until adherence to a semiconductor die is desired. Each of first and second adhesive elements 152 and 154 may preferably be, but is not limited to, about 25 µm in thickness.

Figure 3:
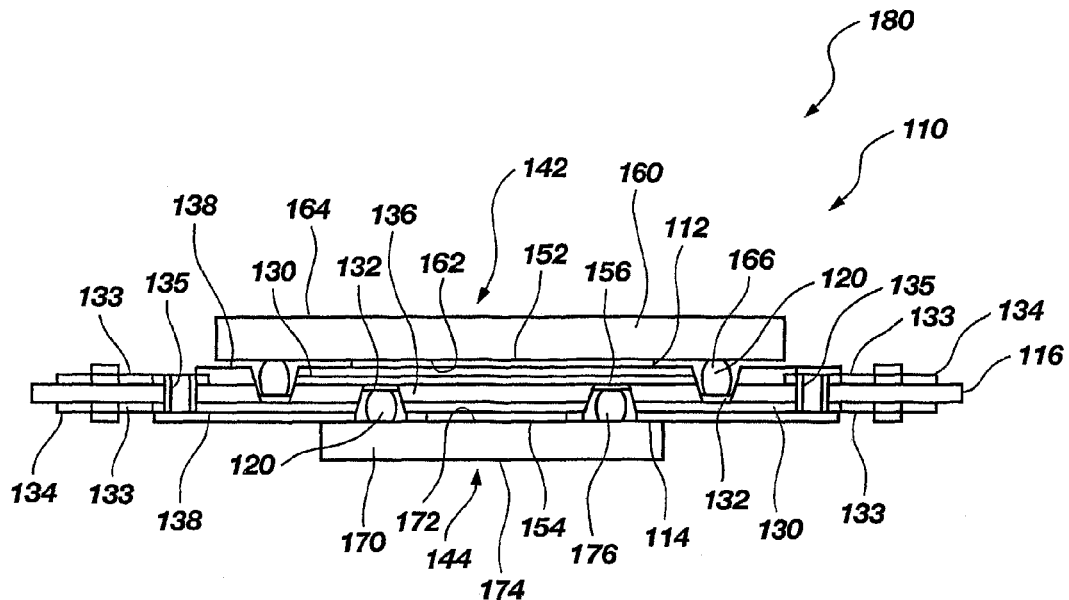
FIG. 3 illustrates mounting a first die and a second die face down to respective first and second surfaces of the interposer substrate to form a flip-chip semiconductor device assembly, according to the present invention.

Referring to FIG. 3, there is illustrated a first semiconductor die 160 and a second semiconductor die 170 mounted face down to the first surface 112 and second surface 114, respectively, of interposer substrate 110 to form a flip-chip semiconductor device assembly 180. Semiconductor die 160 includes an active surface 162 and a back surface 164, wherein the active surface 162 includes a plurality of bond pads bearing electrically conductive bumps 166 thereon. Such conductive bumps 166 formed on the first semiconductor die 160 are arranged in a configuration wherein the recesses 120 of the first recess pattern 122 in the first surface 112 of interposer substrate 110 are sized and arranged to correspond with the bump configuration of the first semiconductor die 160 so that the recesses 120 on first surface 112 and the conductive bumps 166 are a substantially mirror image of each other. Likewise, the second semiconductor die 170 includes an active surface 172 and a back surface 174, wherein the active surface 172 includes a plurality of bond pads bearing electrically conductive bumps 176 thereon. As with the first semiconductor die 160, the conductive bumps 176 formed on the second semiconductor die 170 are arranged in a configuration, wherein the recesses 120 of the second recess pattern 124 in the second surface 114 of interposer substrate 110 are sized and arranged to correspond with the bump configuration of the second semiconductor die 170 so that the recesses 120 on second surface 114 and the conductive bumps 176 are a substantially mirror image of each other.

Conductive bumps 166 and 176 preferably comprise, but are not limited to, conductive balls, pillars or columns. The material of conductive bumps 166 and 176 may include, but is not limited to, any known suitable metals or alloys thereof, such as lead, tin, copper, silver or gold. Conductive or conductor-filled polymers may also be employed, although gold and PbSn solder bumps are currently preferred. The conductive bumps 166 and 176 may be of uniform characteristics throughout or include, for example, a core of a first material (including a nonconductive material) having one or more conductive layers of other materials thereon. Conductive bumps 166 and 176 are preferably formed on the active surface of each semiconductor die at a wafer level, but such is not required. Conductive bumps 166 and 176 may be formed by metal evaporation, electroplating, stencil printing, gold stud bumping by wire bonders, solder reflow or any suitable method known in the art depending, of course, on the material or materials selected for formation thereof.

As depicted in FIG. 3, interposer substrate 110 is mounted to the first semiconductor die 160 and the second semiconductor die 170 to form flip-chip semiconductor device assembly 180, wherein such assembly 180 provides that each of the first semiconductor die 160 and the second semiconductor die 170 and the respective conductive bumps 166 and 176 of first semiconductor die 160 and second semiconductor die 170 are substantially received in a corresponding recess 120 of respective first recess pattern 122 and second recess pattern 124 of interposer substrate 110 and electrically contact the conductive pads 132 at the bottom of each of the recesses 120. The first and second semiconductor dice 160 and 170 may be initially attached by the first and second adhesive elements 152 and 154 on the first and second surfaces 112 and 114, respectively, of the interposer substrate 110. The conductive bumps 166 and 176 on the respective first and second semiconductor dice 160 and 170 may then be bonded to the conductive pads 132 or trace ends in the recesses 120 of interposer substrate 110 by, for example, reflowing the conductive bumps 166 and 176 (in the case of solder bumps) and/or curing the conductive bumps 166 and 176 (in the case of conductive or conductor-filled polymer bumps) as known in the art. Other methods of bonding known in the art may be utilized, such as ultrasonic or thermal compression, with suitable conductive bump materials.

To assist in mounting and bonding the first and second semiconductor dice 160 and 170 to the interposer substrate 110, a nonsolid conductive material in the form of a conductive paste 156 may be provided in the recesses 120 as depicted in FIGS. 2 and 3. Such conductive paste 156 may be disposed in each of the recesses 120 by, for example, overlying the first and second surfaces 112 and 114 of interposer substrate 110 with a stencil (not shown) patterned with openings corresponding with the patterns of recesses and spreading the conductive paste 156 over the stencil to fill the recesses 120 in the interposer substrate 110 with a spread member (not shown). The conductive paste 156 may include, but is not limited to, eutectic solder, conductive epoxy, or any conductive material known in the art. The recesses 120 may be partially or completely filled, as desired. Of course, the surfaces of interposer substrate 110 having recesses 120 opening thereon may also merely be filled with conductive paste 156 and the excess removed, without the use of a stencil.

In another method, the conductive paste 156 may first be disposed on the conductive bumps 166 and 176 prior to assembling the respective first and second semiconductor dice 160 and 170 to the interposer substrate 110 by dipping the conductive bumps 166 and 176 in a pool of conductive paste 156 or by depositing, dispensing or otherwise transferring the conductive paste to the conductive bumps 166 and 176. In still another approach, conductive bumps such as bumps 166 or 176, unattached to a semiconductor die, may be disposed in the conductive paste 156, which is in the recesses 120 corresponding to a particular recess pattern. A semiconductor die having a bond pad configuration with a substantially mirror image of the particular recess pattern may then be aligned with and bonded to the conductive bumps.

If employed, the conductive paste 156 supplements the conductive bumps 166 and 176 in electrical and mechanical interconnection between both the first and second semiconductor dice 160 and 170 and the traces 130 of interposer substrate 110. Further, the conductive paste 156 ensures mechanical and electrical interconnection even if some of the conductive bumps 166 and 176 are inconsistent in height or the recesses 120 are inconsistent in depth, i.e., noncoplanar, wherein the conductive paste 156 is disposed in the recesses 120 between the conductive pads 132 and the conductive bumps 166 and 176. The conductive bumps 166 and 176 and the conductive paste 156 may then be bonded to the conductive pads 132 or trace ends in the recesses 120 of interposer substrate 110 as previously described.

It will be well appreciated by one skilled in the art that, since the conductive bumps 166 and 176 are substantially received within the recesses 120 of the interposer substrate 110 itself when bonded to conductive pads 132, the height of the semiconductor device assembly 180 is minimized. Therefore, the conductive bumps 166 and 176 may be formed of a larger size than in conventional flip-chip assemblies without increasing the height of the flip-chip semiconductor device assembly 180, resulting in an increase of the electrical and mechanical reliability and performance of the interconnections between the interposer substrate 110 and the first and second semiconductor dice 160 and 170. In addition, the first and second adhesive elements 152 and 154 (if used) on the respective first and second surfaces 112 and 114 of the interposer substrate 110 as well as the conductive paste 156 in the recesses 120 (if used) may compensate for any irregularities due to various conductive bump sizes, recess depths and planarity variation in the surfaces of the interposer substrate 110 and the first semiconductor die 160 and second semiconductor die 170.

Further, the recesses 120 in the interposer substrate 110 provide an inherent improved alignment capability in comparison to a conventional flip-chip-type semiconductor device assembly because the conductive bumps 166 and 176 easily slide into their respective corresponding recesses 120 to ensure proper alignment with conductive pads 132 and proper attachment of first and second semiconductor dice 160 and 170 to interposer substrate 110. For example, the recesses 120 may be formed in the interposer substrate 110 to be approximately 125 μm in diameter or width and the conductive bumps 166 formed on the semiconductor die 160 may be about 75 μm in diameter or width. Thus, the dimensions of the recesses 120 accommodate inconsistencies in dimensions and locations of the conductive bumps 166 therein, facilitating die alignment.

Figure 4:
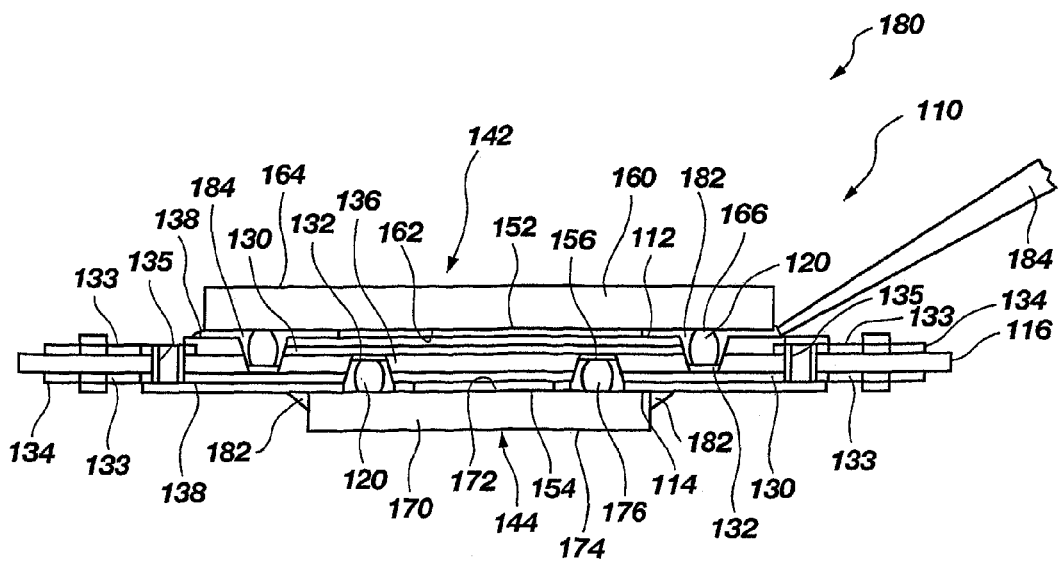
FIG. 4 illustrates applying dielectric filler material to the flip-chip semiconductor device assembly according to the present invention.

As shown in FIG. 4, a dielectric encapsulation material 182 such as what is commonly termed an "underfill" material) may be optionally applied along the periphery of the first semiconductor die 160 and the second semiconductor die 170 adjacent interposer substrate 110 to fill around the conductive bumps 166 and 176, respectively. The method employed to apply the encapsulation material 182 is preferably by pressurized dispensing from dispenser 184, but may include any method known in the art, such as gravity and vacuum-assisted dispensing. In this manner, the encapsulation material 182 may be applied to fill any gaps around the conductive bumps 166, 176 in recesses 120 and the area around first and second adhesive elements 152 and 154. Alternatively, a nonflow film or a nonflow paste may be used as the dielectric encapsulation material 182. The nonflow material, which may comprise a thermoset or thermoplastic material, is applied prior to assembly of the semiconductor dice to the interposer substrate 110. The film or paste, or even a combination of the two forms, allows conductive bumps 166, 176 to penetrate therethrough and effect an electrical connection. Suitable nonconductive films include UF511 and UF527 from Hitachi Chemical, Semiconductor Material Division, Japan. The encapsulation material 182 may be self-curing through a chemical reaction, or a cure accelerated by heat, ultraviolet light or other radiation, or other suitable means in order to form a solid mass in the recesses 120. Such encapsulation material 182 provides enhanced mutual securement of the components of semiconductor device assembly 180, precludes shorting between conductive elements thereof, and protects the conductive elements from environmental elements, such as moisture and dust. Further, compared to underfilling of conventional flip-chip assemblies, underfilling of the flip-chip semiconductor device assembly 180 of the present invention requires less time since the encapsulation material is only directed to fill any gaps around the conductive bumps 166, 176 in recesses 120 and the area around adhesive elements 152 and 154.

Figure 5:
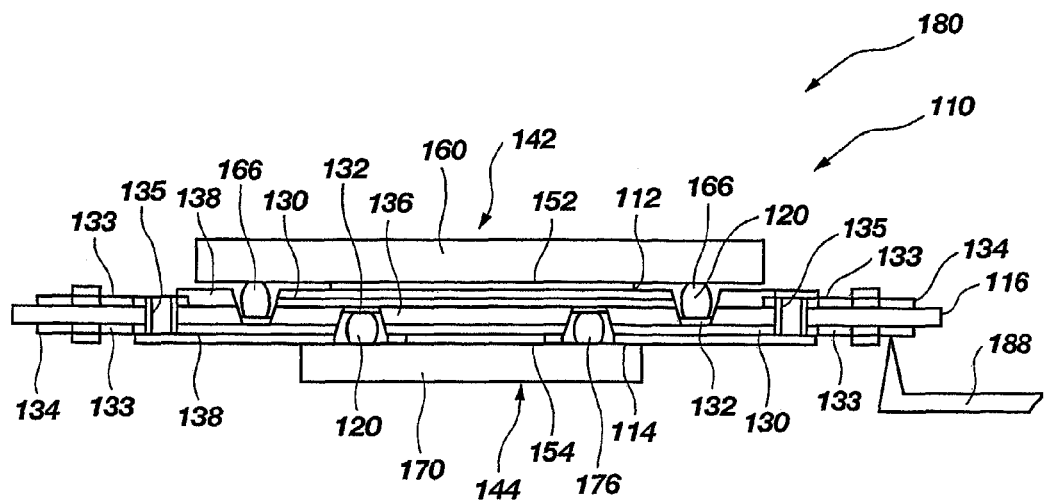
FIG. 5 illustrates testing the flip-chip semiconductor device assembly according to the present invention.

FIG. 5 depicts testing the semiconductor device assembly 180 of the present invention and specifically testing for the electrical integrity of the interconnections between the interposer substrate 110 and the respective first semiconductor die 160 and second semiconductor die 170 as well as functionality of the semiconductor device assembly 180 with test pads 134 provided proximate a periphery 116 of the interposer substrate 110. Such test pads 134 are interconnected with the first semiconductor die 160 and second semiconductor die 170 through the traces 130, conductive pads 132 and respective conductive bumps 166, 176 so that testing members 188 (one shown) such as test probes may be placed on a surface of each test pad 134 and electrical tests performed by conventional test equipment associated therewith (not shown) to determine proper interconnection of the semiconductor device assembly 180. The test pads 134 may be placed on both the first surface 112 and second surface 114 of the interposer substrate 110 at the periphery 116 thereof on a portion of the interposer substrate 110, which is "off-site" from where the first semiconductor die 160 and second semiconductor die 170 are mounted on the interposer substrate 110. Such a test pad configuration enables the sharing of test tooling and hence reduces cost.

Figure 6:
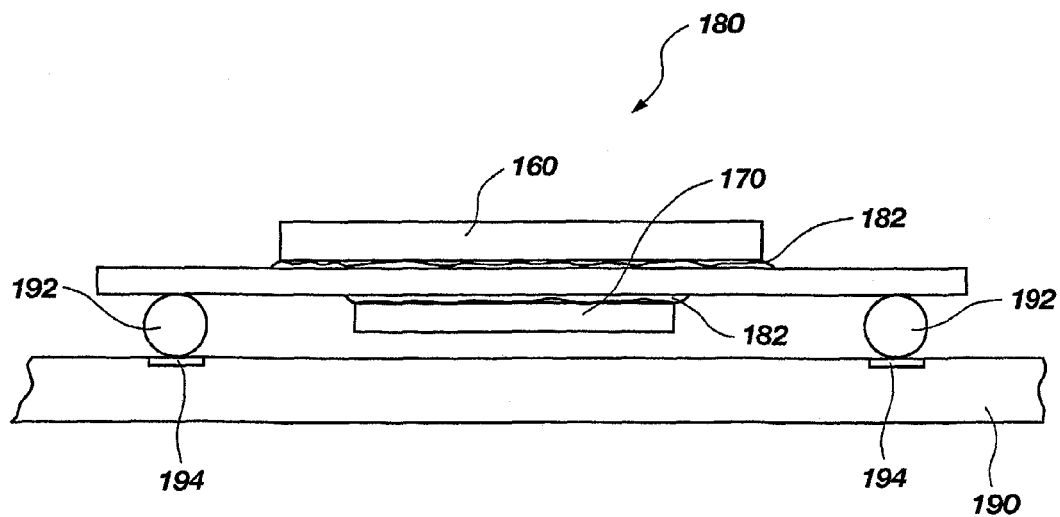
FIG. 6 illustrates mounting a flip-chip semiconductor device assembly according to the present invention to another substrate with conductive elements therebetween.

FIG. 6 depicts a flip-chip semiconductor device assembly 180 of the present invention interconnected to terminal pads 194 of another substrate 190, such as a circuit board, with conductive elements 192 therebetween. The flip-chip semiconductor device assembly 180 may also be stacked with one or more other superimposed semiconductor device assemblies 180 with conductive elements 192 therebetween, wherein the bottom semiconductor device assembly 180 may be interconnected to terminal pads 194 of substrate 190. Interconnection of the conductive elements 192 to interposer substrates 110 may be provided by bonding to the conductive pads 133 exposed on either the first or second surfaces 112, 114 of the interposer substrate 110. The conductive elements 192 may be bonded to the conductive pads 133 prior or subsequent to dispensing the encapsulation material 182.

Figure 7:
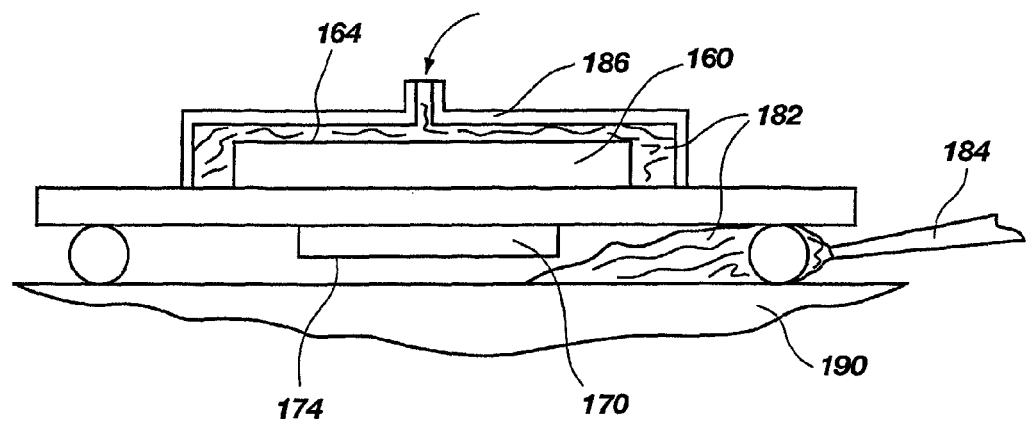
FIG. 7 illustrates applying encapsulation material with a dispenser and encapsulation member to the semiconductor device assembly according to the present invention mounted to another substrate as shown in FIG. 6.
Figure 8:
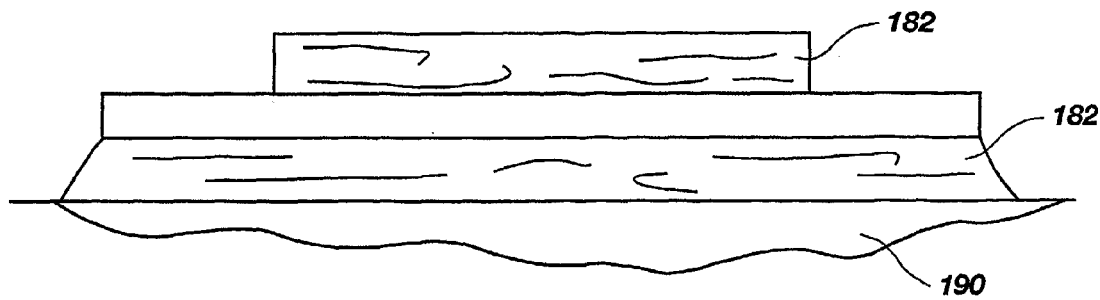
FIG. 8 illustrates a fully encapsulated flip-chip semiconductor device assembly mounted to another substrate as shown in FIG. 6.

Once the conductive elements 192 are bonded to the interposer substrate 110 and the encapsulation material 182 has been provided thereto, complete encapsulation of the flip-chip semiconductor device assembly 180 may be effected, as depicted in FIGS. 7 and 8. In particular, first semiconductor die 160 and second semiconductor die 170 may then be either partially or fully encapsulated by an encapsulation member 186 with an encapsulation material 182. In the case of partially encapsulating the first semiconductor die 160 and second semiconductor die 170, an encapsulation material 182 may be dispensed by dispenser 184 about the periphery thereof so that the back surfaces 164, 174 of the first semiconductor die 160 and second semiconductor die 170 are left exposed. In the case of fully encapsulating the dice, encapsulation material 182 may be provided by dispensing, spin-coating, glob-topping, transfer molding, pot molding or any suitable method known in the art. It is preferred that such encapsulation material 182 be applied to the back surfaces 164 and 174 of the respective first semiconductor die 160 and the second semiconductor die 170 (which may be provided at the wafer level) prior to dispensing encapsulation material 182 about the periphery of first semiconductor die 160 and the second semiconductor die 170 in order to facilitate fully encapsulating each of the dice in the semiconductor device assembly 180.

Figure 9:
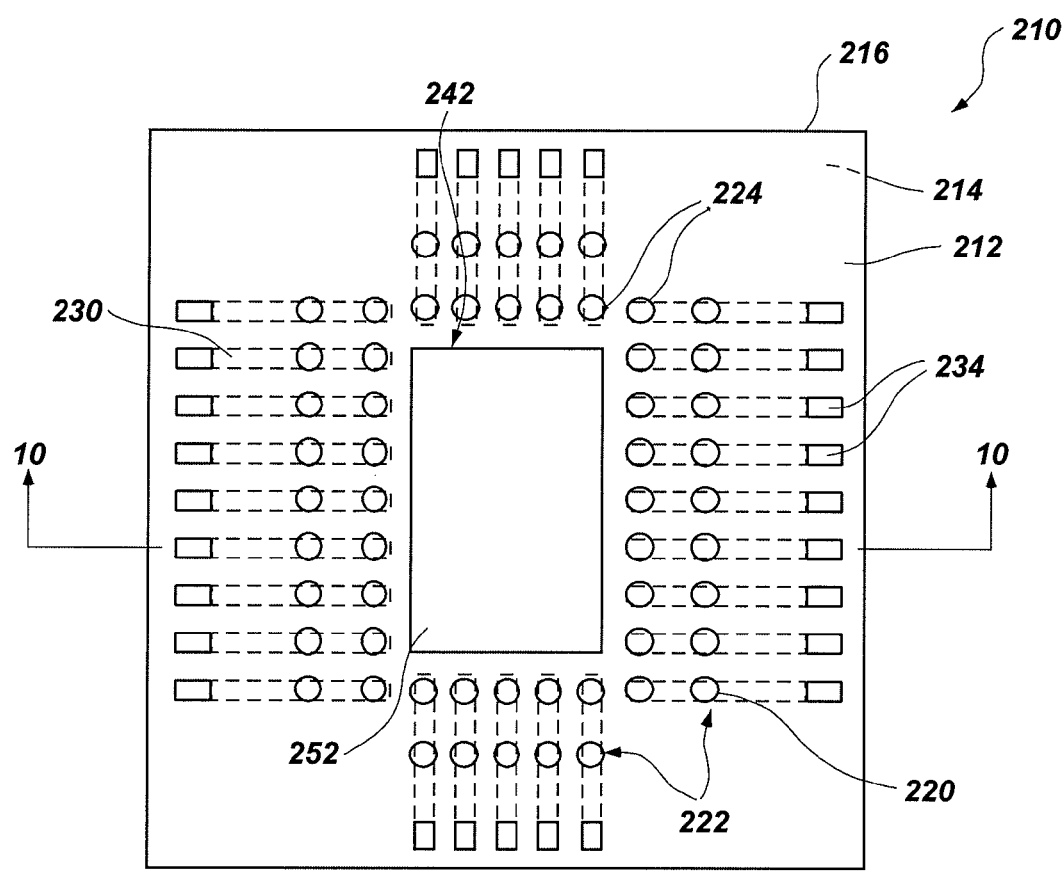
FIG. 9 is a simplified top view of a second embodiment of an interposer substrate according to the present invention, illustrating a first recess pattern and a second, different recess pattern formed in the same surface of the interposer substrate.
Figure 10:
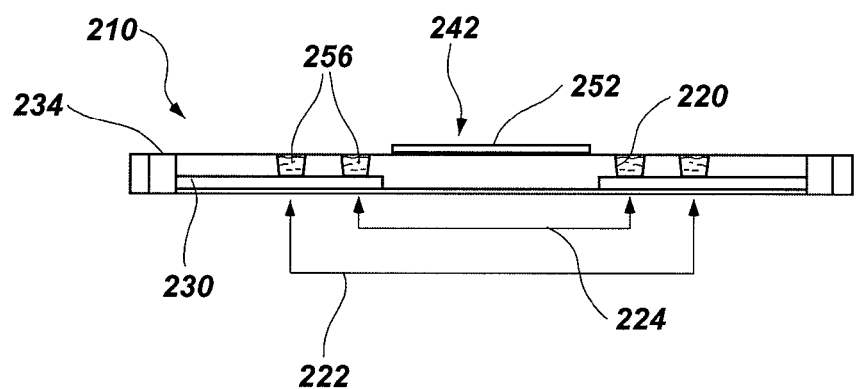
FIG. 10 is a simplified cross-sectional side view taken along line 10-10 in FIG. 9.

FIGS. 9 and 10 depict a second embodiment of the interposer substrate 210 of the present invention, wherein FIG. 9 illustrates a top plan view of a first recess pattern 222 and a second, different recess pattern 224 and FIG. 10 illustrates a cross-sectional side view of the interposer substrate 210 taken along line 10-10 in FIG. 9. As in the first embodiment, interposer substrate 210 includes a first surface 212 and a second surface 214, an adhesive 252 provided on a die attach site 242 on the first surface 212 and traces 230 extending from the bottoms of multiple recesses 220 to test pads 234 on the interposer substrate 210. As such, the second embodiment is substantially similar to the first embodiment in many respects, except the interposer substrate 210 of the second embodiment includes both a first recess pattern 222 and a second recess pattern 224 formed in the first surface 212 of the interposer substrate 210. It should be noted that a recess 220 of the first recess pattern 222 and a recess 220 of the second recess pattern 224 each expose a portion of a common conductive trace extending peripherally outward from a recess 220 of first recess pattern 222 and past a recess 220 of second recess pattern 224 to a test pad 234.

Figure 11:
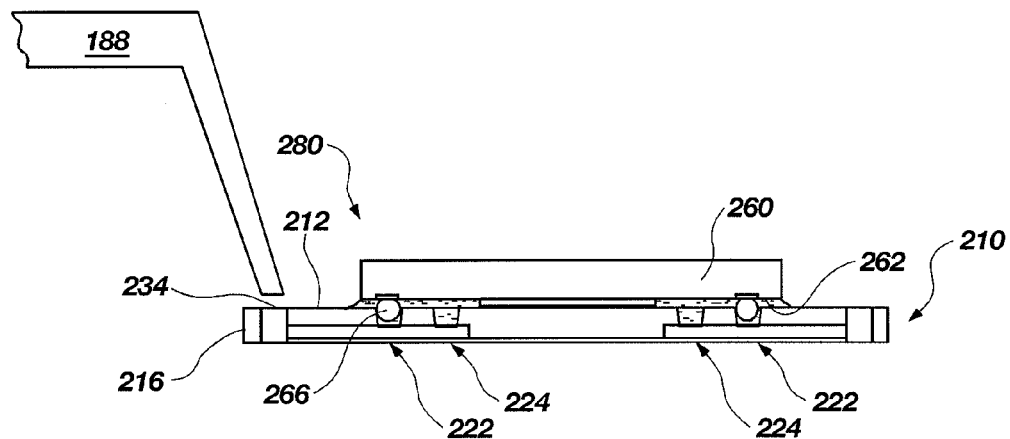
FIG. 11 is a simplified cross-sectional side view of a semiconductor die mounted face down to an interposer substrate with conductive bumps disposed in one of the first recess pattern and the second recess pattern to form a flip-chip semiconductor device assembly according to the present invention under test.

As depicted in FIG. 10, conductive paste 256 may be provided in the recesses 220, after which a semiconductor die 260 may be mounted and bonded to the interposer substrate 210 as shown in FIG. 11 to provide a flip-chip semiconductor device assembly 280 of the present invention. As in the first embodiment, encapsulation material may also be dispensed along a periphery of the semiconductor die 260 to fill the space around and proximate the conductive bumps 266. Further, testing members 188 may also be used to test the electrical integrity and functionality of the flip-chip semiconductor device assembly 280 by placing the testing members 188 directly on the test pads 234 exposed proximate a periphery 216 on the first surface 212 of the interposer substrate 210. Such a locale for testing pads provides easy access and reduces the cost for testing.

According to the present invention, the first and second recess patterns 222 and 224 in the first surface 212 of the interposer substrate 210 provide versatility in that semiconductor dice of different sizes and/or different bumped configurations may optionally be mounted to the first surface of the interposer substrate. Such versatility provides that the first recess pattern 222 and the second recess pattern 224 share a common die attach site, namely, die attach site 242, optionally bearing an adhesive element 252. Further, as in the first embodiment, the recesses 220 are sized and configured to substantially completely receive the conductive bumps 266 of the semiconductor die 260 so that the active surface 262 of the die 260 lies immediately adjacent the first surface 212 of the interposer substrate 210. As such, the semiconductor device assembly 280 of the present invention provides a reduced height compared to conventional flip-chip assemblies.

Figure 12:
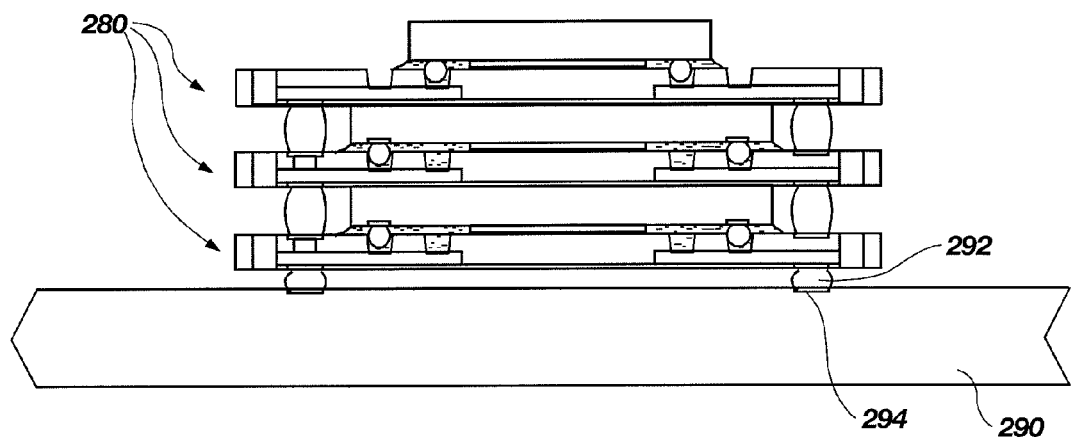
FIG. 12 is a simplified cross-sectional side view of multiple flip-chip semiconductor device assemblies of the second embodiment attached with conductive elements extending therebetween with the bottom interposer substrate attached to another substrate, according to the present invention.

FIG. 12 depicts the semiconductor device assembly 280 of the second embodiment stacked with one or more other assemblies 280, wherein the bottom assembly 280 is interconnected to a substrate 290 with conductive elements 292 therebetween. The one or more other assemblies 280 may include a semiconductor die 260 with a bumped configuration to fit either the first recess pattern and/or the second recess pattern. As such, the first and second recess patterns 222 and 224 on the first surface 212 of the interposer substrate 210 provide optional attachment of differently sized semiconductor dice and/or semiconductor dice with differently sized and configured recess patterns for mounting to a common die attach site 242 on the interposer substrate 210.

As in the first embodiment, the semiconductor device assembly 280 attached by conductive elements 292 to the terminal pads 294 of substrate 290, either stacked with other assemblies 280 or individually on the substrate 290, may then be either fully encapsulated or partially encapsulated by an encapsulation member 186 and/or by a dispenser 184, as previously described in FIGS. 7 and 8.

Figure 13:
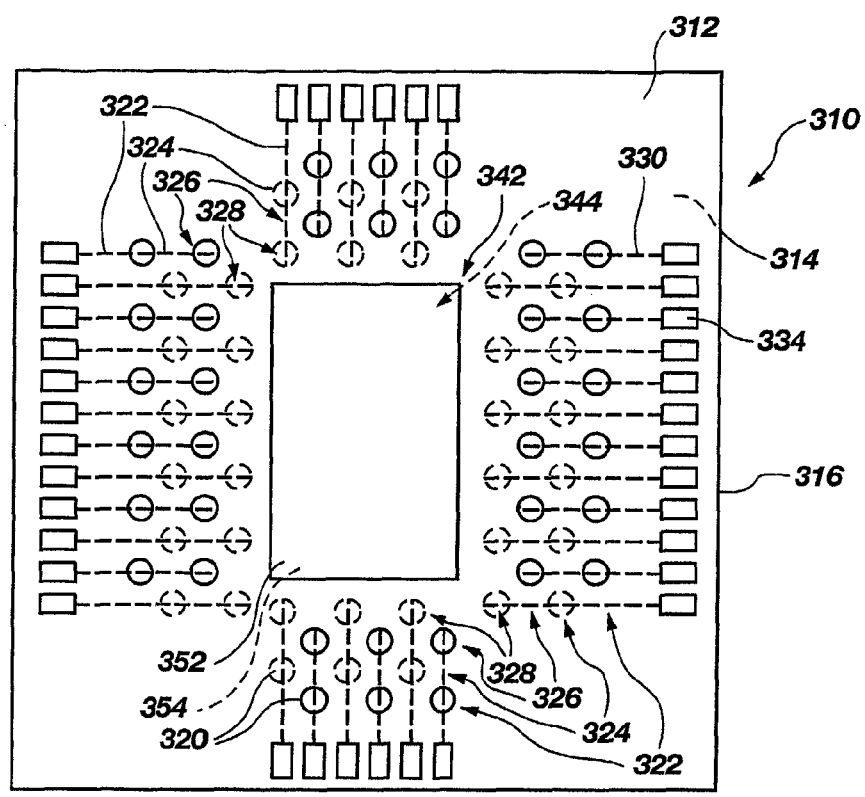
FIG. 13 is a simplified top view of a third embodiment of an interposer substrate, illustrating first, second, third (shown in broken lines) and fourth (shown in broken lines) recess patterns formed in the interposer substrate, according to the present invention.

FIG. 13 depicts a top plan view of a third embodiment of the interposer substrate 310 of the present invention. As in the first embodiment, interposer substrate 310 includes a first surface 312 and a second surface 314 with a respective first adhesive element 352 and a second adhesive element 354 thereon, and traces 330 extending from multiple recesses 320 to testing pads 334 exposed on first and second surfaces 312 and 314 of the interposer substrate 310. Each adhesive element 352 and 354 is provided on a first die attach site 342 and a second die attach site 344 on respective first and second surfaces 312 and 314 of interposer substrate 310. As such, the third embodiment is also similar to the first embodiment in many respects, except the interposer substrate 310 of the third embodiment includes both a first recess pattern 322 and a second recess pattern 326 in the first surface 312 of the interposer substrate 310 and a third recess pattern 324 and a fourth recess pattern 328 in the second surface 314 of the interposer substrate 310. Further, a first adhesive element 352 and a second adhesive element 354 (under first adhesive element 352) are disposed on a center portion of respective first surface 312 and second surface 314 or another portion on the first and second surfaces 312 and 314 unoccupied by recesses 120.

As depicted in FIG. 13, the recesses 320 in the first recess pattern 322 and the second recess pattern 326 may be staggered with respect to the recesses in the third recess pattern 324 and the fourth recess pattern 328. Further, the recesses 320 in the first recess pattern 322 may be relatively more inwardly disposed with respect to the recesses 320 in the second recess pattern 326. Likewise, the recesses 320 in the third recess pattern 324 may be relatively more inwardly disposed with respect to the recesses 320 in the fourth recess pattern 328. With this arrangement, interposer substrate 310 provides versatility to mount differently sized dice in a stacked arrangement on a single interposer substrate 310. That is, the interposer substrate 310 of the present invention provides that variously sized semiconductor dice and/or semiconductor dice having different conductive bump configurations may be optionally mounted on both the first surface 312 and the second surface 314 of the interposer substrate 310. Further, such optional mounting of semiconductor dice provides that the first recess pattern 322 and second recess pattern 326 share a common die attach site, namely, die attach site 342 as well as common conductive traces 330 extending to a set of test pads 334. Likewise, the third recess pattern 324 and the fourth recess pattern 328 also share a common die attach site, specifically, die attach site 344 as well as common conductive traces 330 extending to a set of test pads 334. The mounting and bonding of the first and second dice may be effected as previously described with respect to the first and second embodiments of the present invention.

Further, as in the previous embodiments and as noted above, interposer substrate 310 includes test pads 334 fanned out from recesses 320 proximate a periphery 316 of interposer substrate 310 and exposed on the first surface 312 and/or the second surface 314 of interposer substrate 310. As such, subsequent to mounting semiconductor dice to interposer substrate 310 on the first surface 312 and/or the second surface 314 thereof, the resulting flip-chip semiconductor device assembly may be tested to determine the mechanical and electrical integrity of the interconnections between the semiconductor dice and the interposer substrate 310.

Figure 14:
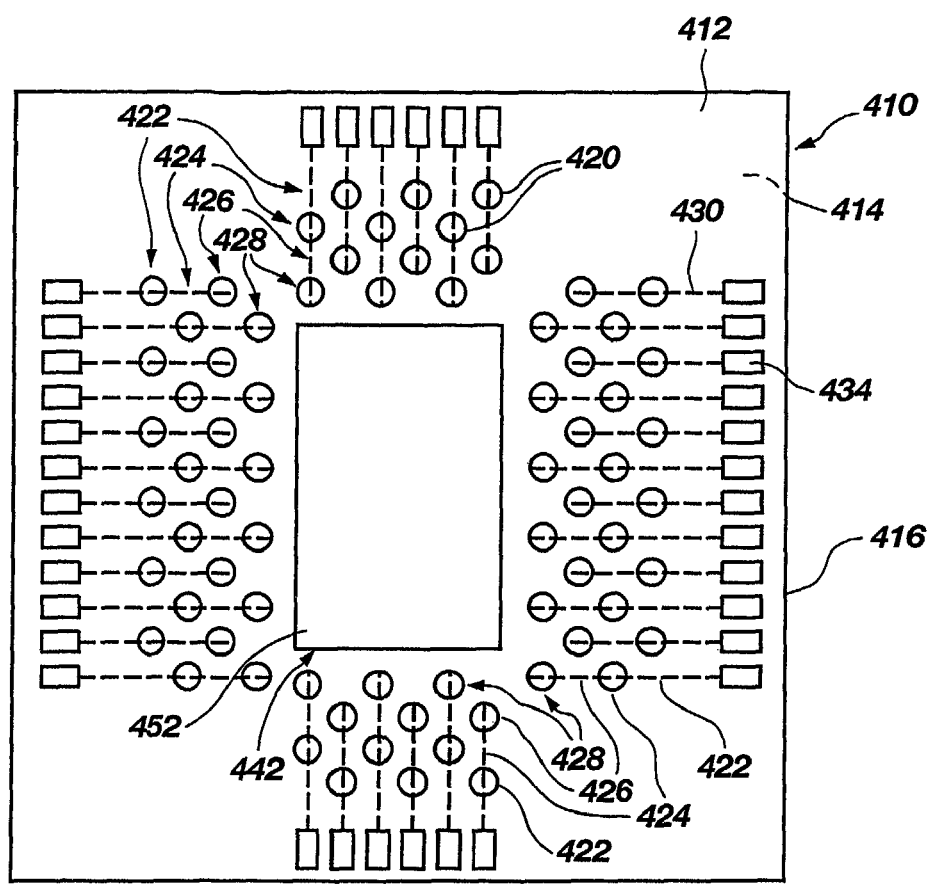
FIG. 14 is a simplified top view of a fourth embodiment of an interposer substrate, illustrating first, second, third and fourth different recess patterns formed in a first surface of an interposer substrate, according to the present invention.

FIG. 14 depicts a top plan view of a fourth embodiment of the interposer substrate 410 of the present invention. As in the first embodiment, interposer substrate 410 includes a first surface 412 and a second surface 414 with an adhesive element 452 on the first surface 412, and traces 430 extending from multiple recesses 420 to testing pads 434 exposed on the first surface 412 of the interposer substrate 410. As such, the fourth embodiment is similar to the first embodiment in many respects, except the interposer substrate 410 of the fourth embodiment includes a first recess pattern 422, a second recess pattern 426, a third recess pattern 424 and a fourth recess pattern 428, each formed in the first surface 412 of the interposer substrate 410.

As depicted in FIG. 14, the recesses 420 in the first recess pattern 422 and the second recess pattern 426 may be staggered with respect to the recesses 420 in the third recess pattern 424 and the fourth recess pattern 428. Further, the recesses 420 in the first recess pattern 422 may be inwardly located with respect to the recesses in the second recess pattern 426, opening onto the same conductive traces 430. Likewise, the recesses 420 in the third recess pattern 424 may be inwardly aligned with respect to the recesses in the fourth recess pattern 428, opening onto the same conductive traces 430. With this arrangement, interposer substrate 410 provides versatility to mount differently sized dice thereon. That is, interposer substrate 410 provides versatility in that variously sized semiconductor dice and/or semiconductor dice having different conductive bump configurations may be optionally mounted on the first surface 412 of interposer substrate 410, wherein each recess pattern includes a common die attach site 442. The mounting of the semiconductor die may be employed as previously described with respect to the first and second embodiments of the present invention.

Further, as in the previous embodiments, interposer substrate 410 includes test pads 434 fanned out from recesses 420 proximate a periphery 416 of interposer substrate 410 and exposed on the first surface 412 of interposer substrate 410. Test pads 434 are each common to two recess patterns, as shown in FIG. 14. As such, subsequent to mounting semiconductor dice to the first surface 412 of interposer substrate 410, the resulting flip-chip semiconductor device assembly may be tested to ensure that electrical interconnection has been successfully made and satisfactory functionality is exhibited, as described previously with respect to the first and second embodiments.

Similar to that described in each of the previous embodiments, the interposer substrate of the present invention may also be assembled at a wafer level, wherein the interposer substrate is a wafer scale interposer substrate including at least two different recess patterns. As such, the wafer scale interposer substrate may facilitate assembly with different wafers having different bumped configurations that correspond with the at least two different recess patterns in the wafer scale interposer substrate. In this manner, optional wafers with different bumped configurations may be attached face (active surface) down to the wafer scale interposer substrate with conductive bumps on the wafer disposed and substantially received in recesses formed in the interposer substrate. The wafer and interposer substrate may then be singulated or diced into individual semiconductor assemblies. Partial encapsulation of the semiconductor dice on the wafer or wafers may be performed at the wafer level and completed subsequent to being diced into individual flip-chip semiconductor device assemblies according to the present invention.

Figure 15:
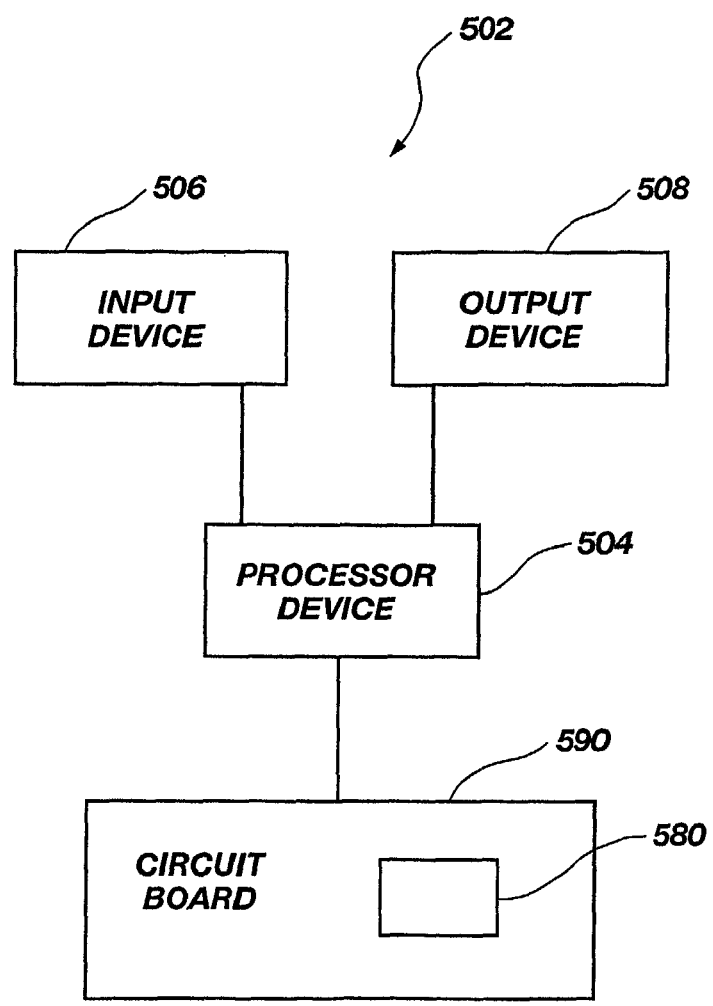
FIG. 15 is a simplified block diagram of the semiconductor assembly of the present invention integrated in a computer system.

As illustrated in block diagram form in FIG. 15, an exemplary flip-chip semiconductor device assembly 580 of the present invention, as previously described herein with respect to various embodiments, is mounted to a circuit board 590, such as previously discussed substrate 190, in an electronic system, such as a computer system 502. In the computer system 502, the circuit board 590 is connected to a processor device 504 that communicates with an input device 506 and an output device 508. The input device 506 may include a keyboard, mouse, joystick, cell phone, PDA system, or any other electronic input device. The output device 508 may include a monitor, a printer, a storage device, such as a disk drive, a cell phone, a PDA system, or any other electronic output device. The processor device 504 may be, but is not limited to, a microprocessor or a circuit card including hardware for processing computer instructions. Additional structure for an electronic system, such as a computer system 502, would be readily apparent to those skilled in the art.

Figure 16:
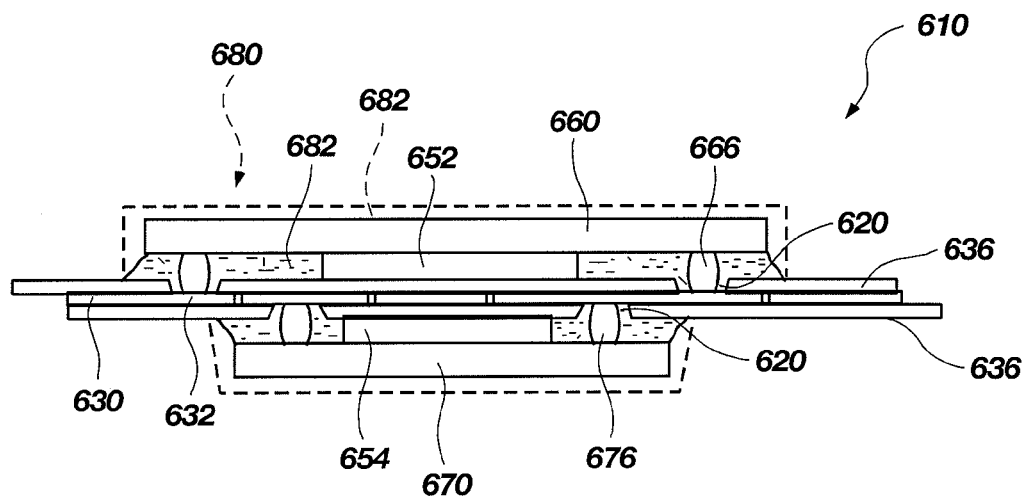
FIG. 16 is a simplified cross-sectional side view of a fifth embodiment of a semiconductor device assembly according to the present invention.

Yet another embodiment of the present invention is depicted in FIG. 16 of the drawings. Interposer substrate 610 is comprised of a single conductive layer sandwiched between two dielectric members 636. The conductive layer may be patterned into a plurality of conductive traces 630 including conductive pads 632, which may comprise trace ends, exposed through a plurality of recesses 620 formed through both dielectric members 636. It is contemplated that the conductive layer may be provided as a sheet or film of copper adhered to one dielectric member 636 and conductive traces 630 formed by etching the copper, subsequent to which a second dielectric member is superimposed on the conductive traces, although the invention is not so limited. Recesses 620 may be preformed in one or both dielectric members 636, or formed in one or both dielectric members 636 after the laminated structure of interposer substrate 610 is formed.

As also depicted in FIG. 16, a first semiconductor die 660 and a second semiconductor die 670 are respectively connected to conductive traces 630 by conductive bumps 666 and 676, which extend into recesses 620 to contact conductive pads 632. A conductive paste (not shown) may be disposed in recesses 620 or conductive bumps 666 and 676 dipped therein to enhance the connections between conductive bumps 666, 676 and the conductive pads 632 at the bottoms of recesses 620, as previously discussed with respect to other embodiments. Furthermore, semiconductor dice 660 and 670 may be respectively adhered to exterior surfaces of interposer substrate 610 by adhesive elements 652 and 654, again as previously discussed. If desired, a dielectric encapsulant material 682, which may be any previously disclosed herein or otherwise suitable for use, may be introduced between each semiconductor die 660, 670 and its adjacent dielectric member 636 to fill the standoff area therebetween as well as any portions of recesses 620 unfilled by conductive bumps 666 and 676. Further, and if desired, semiconductor dice 660 and 670 may be encapsulated about their peripheries and back sides as shown in broken lines to provide a fully encapsulated package 680. As with other embodiments, enlarged conductive bumps may be formed at appropriate locations on one or both sides of interposer substrate 610 through other recesses in a dielectric member 636 for connection of the semiconductor device package 680 to other packages or to a carrier substrate (not shown).

In lieu of stacking semiconductor packages 680, however, it is contemplated that either approach to the present invention, comprising a flexible interposer substrate using dual conductive layers having a dielectric member interposed therebetween or a single conductive layer interposed between two dielectric members, may be employed to implement a folded interposer substrate package according to the present invention. An exemplary embodiment of a dual-sided folded interposer substrate package is disclosed in FIG. 17.

Figure 17:
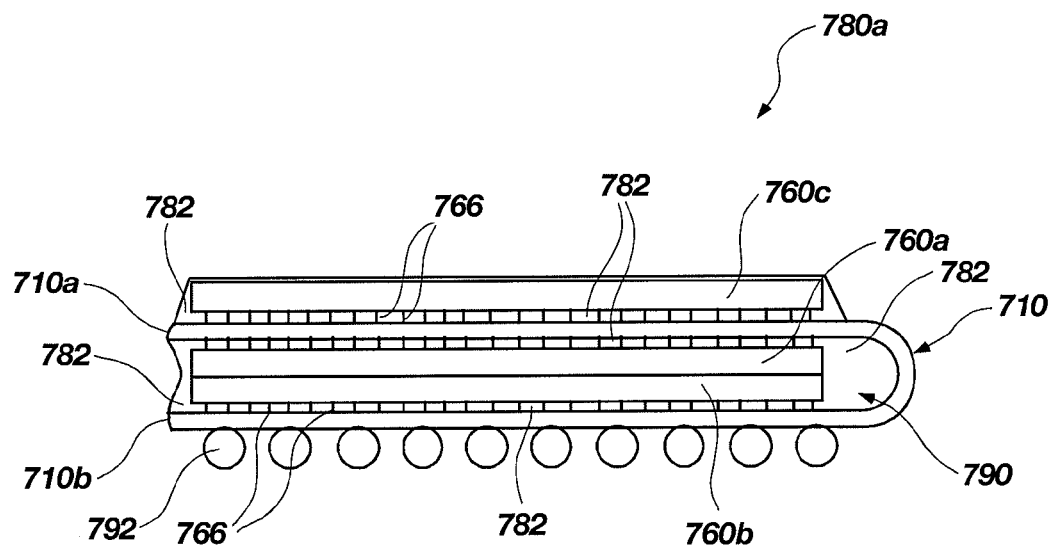
FIG. 17 is a simplified side view of a sixth embodiment of a semiconductor device assembly according to the present invention.

FIG. 17 depicts an interposer substrate 710, which may comprise either a dual conductive layer or single conductive layer interposer substrate according to the present invention, folded over upon itself in two portions 710a and 710b, with back-to-back semiconductor dice 760a and 760b therebetween and a third semiconductor die 760c on portion 710a.

All three semiconductor dice 760a-760c are flip-chip configured with conductive bumps 766 projecting therefrom into recesses (not shown for clarity) in interposer substrate 710 as discussed with respect to previous embodiments. The standoff areas between each semiconductor dice 760a-760c and its adjacent portion of interposer substrate 710 may be filled with an encapsulant material 782, as may the peripheries and back sides of the semiconductor dice 760a-760c and the bight area 790 of the fold between interposer substrate portions 710a and 710b. Enlarged conductive elements 792 may be employed to connect the interposer substrate 710 to higher-level packaging, such as a carrier substrate in the form of a printed circuit board. Exemplary folded interposer substrate package 780a results. Folded interposer substrate package 780a may be formed by respectively connecting semiconductor dice 760a and 760b to the same side of interposer substrate 710 in unfolded or planar form over then-laterally adjacent portions 710a and 710b, then folding the substrate 710 and adhering semiconductor dice 760a and 760b back-to-back, after which semiconductor die 760c is connected to interposer substrate portion 710a and encapsulation and bumping with enlarged conductive elements may be completed. Semiconductor dice 760a-760c may be of the same type or origin or of different types or origin, as desired, and perform the same or different functions.

While the present invention has been disclosed in terms of certain exemplary embodiments and variations thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention. For example, features of the fourth embodiment may be combined with the second embodiment, wherein the first surface of the interposer substrate may include four recess patterns and the second surface of the interposer substrate may include two recess patterns. Further, any number of recess patterns may be provided on the first surface and/or the second surface of the interposer substrate for optional semiconductor die attachment thereto.

What is claimed is:

1. An article for use in mounting at least one flip-chip semiconductor die having a plurality of conductive bumps projecting therefrom, comprising:

an interposer substrate having a first surface and a second surface and comprising at least one dielectric member supporting at least one conductive layer secured thereto, the at least one conductive layer comprising a plurality of substantially linear conductive traces arranged in four groups of traces, each group comprising at least two conductive traces oriented substantially perpendicular to a side of a die attach site on at least one of the first surface and the second surface, the interposer substrate including a plurality of recesses in at least one of the first and second surfaces extending through a thickness of the at least one dielectric member to expose portions of the conductive traces of the plurality, the plurality of recesses arranged in a first recess pattern extending peripherally about the die attach site for receiving conductive bumps of a flip-chip semiconductor die in a first bump pattern and a second recess pattern extending peripherally about the die attach site and substantially co-centered with the first recess pattern about the die attach site on the interposer substrate for receiving conductive bumps of a flip-chip semiconductor die in a second, different bump pattern, each of the first recess pattern and the second recess pattern configured to receive conductive bumps of a flip-chip semiconductor die while the interposer substrate is in a substantially planar configuration; and recesses of the first recess pattern exposing a first portion and a longitudinally spaced second portion of conductive traces of the plurality and recesses of the second recess pattern exposing a first portion and a longitudinally spaced second portion of other, different conductive traces of the plurality, wherein each conductive trace having first and second portions exposed by recesses of the first recess pattern is laterally adjacent at least one mutually parallel conductive trace having first and second portions exposed by recesses of the second recess pattern, and wherein each recess of the first recess pattern exposing a first portion or a second portion of a conductive trace is longitudinally staggered and laterally offset with respect to each recess of the second recess pattern exposing a first portion or a second portion of the at least one laterally adjacent conductive trace, each exposed portion of a conductive trace being longitudinally staggered with respect to any exposed portion of a laterally adjacent conductive trace.

2. The article of claim 1, wherein the first recess pattern is formed in the first surface of the interposer substrate and the second recess pattern is formed in the second surface of the interposer substrate.

3. The article of claim 1, wherein each of the plurality of recesses is sized and configured to substantially completely receive a conductive bump of the at least one flip-chip semiconductor die so that an active surface of the at least one flip-chip semiconductor die, when mounted on the interposer substrate on the die attach site, lies immediately adjacent a surface of the interposer substrate having recesses in which conductive bumps of the at least one flip-chip semiconductor die are to be received.

4. The article of claim 1, wherein the first recess pattern and the second recess pattern are formed in the first surface of the interposer substrate.

5. The article of claim 4, wherein the first recess pattern and the second recess pattern share a common first die attach site.

6. The article of claim 1, wherein the die attach site includes an adhesive element positioned on at least one of the first surface and the second surface of the interposer substrate.

7. The article of claim 1, further comprising test pads for testing an assembly of the interposer substrate having the at least one flip-chip semiconductor die mounted thereto on one of the first surface and the second surface thereof, the test pads lying proximate a periphery of the interposer substrate, each of the test pads directly conductively connected to a conductive trace at an end thereof remote from the die attach site and exposed on the one of the first surface and the second surface of the interposer substrate to which the at least one flip-chip semiconductor die is mounted.

8. The article of claim 1, wherein the interposer substrate comprises a flexible tape.

9. The article of claim 1, wherein the interposer substrate comprises at least one of a polymer material, BT, FR4 laminate, FR5 laminate and ceramic.

10. A semiconductor assembly comprising:
at least one semiconductor die having an active surface and a back surface, one of the active surface and the back surface having conductive bumps projecting therefrom;
an interposer substrate having a first surface and a second surface and comprising at least one dielectric member supporting at least one conductive layer secured thereto, the at least one conductive layer including a plurality of substantially linear conductive traces arranged in four groups of traces, each group comprising at least two conductive traces oriented substantially perpendicular to a side of a die attach site on at least one of the first surface and the second surface, the interposer substrate including a plurality of recesses in at least one of the first and second surfaces extending through a thickness of the at least one dielectric member and exposing portions of the conductive traces of the plurality through the at least one dielectric member, the plurality of recesses arranged in a first recess pattern extending peripherally about the die attach site for receiving conductive bumps of a semiconductor die in a first bump pattern and a second recess pattern extending peripherally about the die attach site and substantially co-centered the first recess pattern about die attach site on one of the first surface and the second surface of the interposer substrate for receiving conductive bumps of another, different semiconductor die in a second bump pattern, each of the first recess pattern and the second recess pattern configured to receive conductive bumps of a flip-chip semiconductor die while the interposer substrate is in a substantially planar configuration; and recesses of the first recess pattern exposing a first portion and a longitudinally spaced second portion of conductive traces of the plurality and recesses of the second recess pattern exposing a first portion and a longitudinally spaced second portion of other, different conductive traces of the plurality, wherein each conductive trace having first and second portions exposed by recesses of the first recess pattern is laterally adjacent at least one mutually parallel conductive trace having first and second portions exposed by recesses of the second recess pattern, and wherein each recess of the first recess pattern exposing a first portion or a second portion of a conductive trace is longitudinally staggered and laterally offset with respect to each recess of the second recess pattern exposing a first portion or a second portion of the at least one laterally adjacent conductive trace, each exposed portion of a conductive trace being longitudinally staggered with respect to any exposed portion of a laterally adjacent conductive trace;

wherein the at least one semiconductor die is mounted to the die attach site and all of the conductive bumps of the at least one semiconductor die are received in only one of the first pattern and the second pattern of recesses of the plurality extending peripherally about the die attach site on the one of the first surface and the second surface of the interposer substrate on which the at least one semiconductor die is mounted.

11. The assembly of claim 10, wherein the conductive bumps on the at least one semiconductor die are substantially completely disposed in recesses of the plurality so that the active surface of the at least one semiconductor die lies immediately adjacent a surface of the interposer substrate having recesses in which conductive bumps of the at least one semiconductor die are received.

12. The assembly of claim 10, wherein the first surface of the interposer substrate includes the first recess pattern and the second recess pattern.

13. The assembly of claim 12, wherein the first recess pattern and the second recess pattern share a common first die attach site.

14. The assembly of claim 10, wherein the die attach site includes at least one adhesive element thereon positioned on at least one of the first surface and the second surface of the interposer substrate and the at least one semiconductor die is adhered to the at least one die attach site by the at least one adhesive element.

15. The assembly of claim 10, further comprising test pads for testing the semiconductor assembly proximate a periphery of the interposer substrate, each of the test pads being directly conductively connected to one of the conductive traces at an end thereof remote from the die attach site and exposed on the one of the first surface and the second surface of the interposer substrate on which the at least one semiconductor die is mounted.

16. The assembly of claim 10, wherein the interposer substrate comprises a flexible tape.

17. The assembly of claim 10, wherein the interposer substrate comprises at least one of a polymer material, BT, FR4 laminate, FR5 laminate and ceramic.

18. The assembly of claim 10, further comprising dielectric filler material proximate the conductive bumps received in the recesses.

19. The assembly of claim 10, further comprising a circuit board conductively connected to the conductive traces of the interposer substrate by conductive elements disposed therebetween.

20. The assembly of claim 19, further comprising an encapsulation material at least partially encapsulating the at least one semiconductor die.

21. The assembly of claim 10, wherein the first recess pattern is formed in the first surface of the interposer substrate and the second recess pattern is formed in the second surface of the interposer substrate.

22. An electronic system comprising:
a processor device coupled to an input device and an output device; and
a semiconductor assembly coupled to at least one of the processor device, the input device and the output device, the semiconductor assembly comprising:
at least one semiconductor die having an active surface and a back surface, one of the active surface and the back surface having a plurality of conductive bumps projecting therefrom; and
an interposer substrate having a first surface and a second surface and comprising at least one dielectric member supporting at least one conductive layer secured thereto, the at least one conductive layer including a plurality of substantially linear conductive traces arranged in four groups of traces, each group comprising at least two conductive traces oriented substantially perpendicular to a side of a die attach site on at least one of the first surface and the second surface, the interposer substrate including a plurality of recesses in at least one of the first and second surfaces extending through a thickness of the at least one dielectric member and exposing portions of the conductive traces of the plurality through the at least one dielectric member and arranged in a first recess pattern extending peripherally about the die attach site for receiving conductive bumps of a semiconductor die in a first bump pattern and a second recess pattern extending peripherally about the die attach site and substantially co-centered the first recess pattern about the die attach site on one of the first surface and the second surface of the interposer substrate for receiving conductive bumps of a semiconductor die in a second, different bump pattern, each of the first recess pattern and the second recess pattern configured to receive conductive bumps of a flip-chip semiconductor die while the interposer substrate is in a substantially planar configuration; and
recesses of the first recess pattern exposing a first portion and a longitudinally spaced second portion of conductive traces of the plurality and recesses of the second recess pattern exposing a first portion and a longitudinally spaced second portion of other, different conductive traces of the plurality, wherein each conductive trace having first and second portions exposed by recesses of the first recess pattern is laterally adjacent at least one mutually parallel conductive trace having first and second portions exposed by recesses of the second recess pattern, and each recesses of the first recess pattern exposing a first portion or a second portion of a conductive trace is longitudinally staggered and laterally offset with respect to each portion of any laterally adjacent conductive trace exposed by recesses of the second recess pattern, wherein each exposed portion of a conductive trace is longitudinally staggered with respect to any exposed portions of a laterally adjacent conductive trace;
wherein the at least one semiconductor die is mounted to the die attach site and all the conductive bumps of the at least one semiconductor die are received in only one of the first pattern or the second pattern of recesses of the plurality extending peripherally about the die attach site on the one of the first surface and the second surface of the interposer substrate on which the at least one semiconductor die is mounted.

23. The system of claim 22, wherein the plurality of conductive bumps on the at least one semiconductor die are substantially completely disposed in recesses of the plurality so that a surface of the at least one semiconductor die lies immediately adjacent the one of the first surface and the second surface of the interposer substrate on which the at least one semiconductor die is mounted.

24. The system of claim 22, wherein the first surface of the interposer substrate includes the first recess pattern and the second recess pattern.

25. The system of claim 24, wherein the first recess pattern and the second recess pattern share a common first die attach site.

26. The system of claim 22, wherein the die attach site includes an adhesive element thereon positioned on the at least one of the first surface and the second surface of the interposer substrate for mounting the at least one semiconductor die thereto.

27. The system of claim 22, further comprising test pads for testing the semiconductor assembly proximate a periphery of the interposer substrate, each of the test pads in direct conductive communication with one of the conductive traces at an end thereof remote from the die attach site and exposed on the one of the first surface and the second surface of the interposer substrate on which the at least one semiconductor die is mounted.

28. The system of claim 22, wherein the interposer substrate comprises a flexible tape.

29. The system of claim 22, wherein the interposer substrate comprises at least one of a polymer material, BT, FR4 laminate, FR5 laminate and ceramic.

30. The system of claim 22, further comprising dielectric filler material disposed proximate the plurality of conductive bumps disposed in the recesses of the at least one of the at least the first recess pattern and the second recess pattern.

31. The system of claim 22, further comprising an encapsulation material at least partially encapsulating the at least one semiconductor die and the interposer substrate.

32. The system of claim 22, wherein the first recess pattern is formed in the first surface of the interposer substrate and the second recess pattern is formed in the second surface of the interposer substrate.

* * * * *

UNITED STATES PATENT AND TRADEMARK OFFICE
CERTIFICATE OF CORRECTION

PATENT NO. : 7,915,718 B2  
APPLICATION NO. : 10/150892  
DATED : March 29, 2011  
INVENTOR(S) : Teck Kheng Lee et al.

Page 1 of 1

It is certified that error appears in the above-identified patent and that said Letters Patent is hereby corrected as shown below:

In column 20, line 16, in Claim 10, delete "co-centered the" and insert -- co-centered with the --, therefor.

In column 21, line 63, in Claim 22, delete "co-centered the" and insert -- co-centered with the --, therefor.

Signed and Sealed this  
Thirty-first Day of May, 2011

David J. Kappos  
*Director of the United States Patent and Trademark Office*